US008923765B2

(12) United States Patent
Behzad et al.

(10) Patent No.: US 8,923,765 B2
(45) Date of Patent: Dec. 30, 2014

(54) ESTABLISHING A WIRELESS COMMUNICATIONS BUS AND APPLICATIONS THEREOF

(75) Inventors: Arya Reza Behzad, Poway, CA (US); Michael Boers, Irvine, CA (US); Jesus Alfonso Castaneda, Los Angeles, CA (US); Ahmadreza (Reza) Rofougaran, Newport Coast, CA (US); Sam Ziqun Zhao, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 650 days.

(21) Appl. No.: 12/877,868

(22) Filed: Sep. 8, 2010

(65) Prior Publication Data

US 2011/0183617 A1    Jul. 28, 2011

Related U.S. Application Data

(60) Provisional application No. 61/298,751, filed on Jan. 27, 2010.

(51) Int. Cl.
| | | |
|---|---|---|
| H04B 7/00 | (2006.01) | |
| H01L 23/48 | (2006.01) | |
| H01L 23/66 | (2006.01) | |
| H04L 12/40 | (2006.01) | |
| H04W 84/18 | (2009.01) | |
| H04W 8/00 | (2009.01) | |

(52) U.S. Cl.
CPC .............. *H04W 84/18* (2013.01); *H01L 23/48* (2013.01); *H01L 23/66* (2013.01); *H04L 12/4011* (2013.01); *H01L 2223/6677* (2013.01); *H04W 8/005* (2013.01)

USPC .......................................................... 455/41.2
(58) Field of Classification Search
CPC    H01L 2223/6677; H01L 23/48; H04W 84/18
USPC .......................................................... 455/41.2
See application file for complete search history.

(56) References Cited

U.S. PATENT DOCUMENTS

| 7,315,577 B2 * | 1/2008 | Shao ............................. 375/260 |
| 2003/0133339 A1 * | 7/2003 | Estes et al. ..................... 365/200 |

(Continued)

FOREIGN PATENT DOCUMENTS

| EP | 1 940 087 A2 | 7/2008 |
| EP | 1 940 087 A3 | 6/2010 |
| WO | WO2008/088188 A1 | 7/2008 |

OTHER PUBLICATIONS

European Search Report for Application No. 11000397.7, Dated: Jun. 6, 2011, 4 pages.

(Continued)

*Primary Examiner* — David Bilodeau
(74) *Attorney, Agent, or Firm* — Sterne, Kessler, Goldstein & Fox P.L.L.C.

(57) ABSTRACT

Disclosed herein are systems, apparatuses, and methods for establishing wireless communications among a plurality of wireless-enabled components (WECs), and applications thereof. Such a system includes a plurality of WECs, each configured to transmit and receive over a wireless bus. The wireless bus includes (i) a first channel to identify proximally located WECs and (ii) a second channel to support communications among the proximally located WECs. The plurality of WECs may be located on a single chip, on multiple chips of a single device, or on multiple chips across multiple devices.

27 Claims, 28 Drawing Sheets

(56) References Cited

U.S. PATENT DOCUMENTS

| | | |
|---|---|---|
| 2005/0113120 A1* | 5/2005 | Rappaport et al. ............ 455/500 |
| 2005/0265503 A1* | 12/2005 | Rofheart et al. .............. 375/354 |
| 2006/0176851 A1 | 8/2006 | Bennett et al. |
| 2006/0211449 A1* | 9/2006 | Haque et al. ............... 455/556.1 |
| 2007/0223310 A1 | 9/2007 | Tran |
| 2007/0262872 A1* | 11/2007 | Carrender et al. ......... 340/572.7 |
| 2008/0175199 A1* | 7/2008 | Shao et al. .................... 370/329 |
| 2009/0238251 A1 | 9/2009 | Rofougaran |
| 2009/0298478 A1* | 12/2009 | Tyhurst et al. ............. 455/414.1 |
| 2010/0222046 A1* | 9/2010 | Cumming .................... 455/418 |
| 2010/0302958 A1* | 12/2010 | Wietfeldt et al. ............. 370/252 |
| 2011/0182218 A1* | 7/2011 | Rofougaran et al. ......... 370/310 |
| 2011/0183610 A1* | 7/2011 | Castaneda et al. ........... 455/41.1 |
| 2011/0183616 A1* | 7/2011 | Rofougaran et al. ........ 455/41.2 |
| 2011/0183617 A1* | 7/2011 | Behzad et al. ............... 455/41.2 |
| 2011/0183618 A1* | 7/2011 | Behzad et al. ............... 455/41.2 |
| 2011/0183630 A1* | 7/2011 | Rofougaran et al. ........... 455/73 |
| 2011/0183699 A1* | 7/2011 | Rofougaran et al. ......... 455/509 |
| 2011/0185091 A1* | 7/2011 | Rofougaran et al. ......... 710/106 |
| 2011/0185092 A1* | 7/2011 | Boers et al. .................. 710/106 |

OTHER PUBLICATIONS

Office Action for related Chinese Patent Application No. 201100285178, mailed May 2, 2013; 7 pages.

* cited by examiner

300

ESTABLISHING A WIRELESS COMMUNICATIONS BUS AND APPLICATIONS THEREOF

CROSS REFERENCE TO RELATED APPLICATIONS

This application claims benefit under 35 U.S.C. §119(e) to U.S. Provisional Application No. 61/298,751 to Behzad et al., entitled "Establishing a Wireless Communications Bus and Applications Thereof," filed Jan. 27, 2010, the entirety of which is incorporated by reference herein.

BACKGROUND

1. Field of the Invention

The present invention generally relates to communications among integrated circuits (ICs), communications among functional blocks of such ICs, communications among devices that include ICs, and applications thereof.

2. Background Art

A typical IC includes transistors and/or logic that are configured into functional blocks. Example functional blocks may include, but are not limited to, an execution unit (e.g., an arithmetic logic unit), a memory unit (e.g., a cache), and a signal processing block. Functional blocks of a conventional IC are coupled together via Ohmic contacts, which are typically metal. Example Ohmic contacts include wires, traces, and signal lines.

Like functional blocks, groups of ICs may also be coupled together via Ohmic contacts. ICs are typically coupled together on a printed circuit board (PCB). The coupled ICs may be used to form a device—such as, for example, a supercomputer, a desktop computer, a laptop computer, a videogame console, an embedded device, a handheld device (e.g., a mobile telephone, smart phone, MP3 player, a camera, a GPS device), or the like.

Unfortunately, the Ohmic contacts used to couple functional blocks and ICs may limit the performance, the capabilities, and/or the form factors of the functional blocks and ICs.

BRIEF DESCRIPTION OF THE DRAWINGS/FIGURES

The accompanying drawings, which are incorporated herein and form a part of the specification, illustrate embodiments of the present invention and, together with the description, further serve to explain the principles of embodiments of the invention and to enable a person skilled in the pertinent art to make and use the invention.

FIG. 1 illustrates an example wireless bus enabled by a plurality of wireless-enabled components (WECs) according to an embodiment of the present invention.

FIGS. 2A-B illustrate example WECs according to embodiments of the present invention.

FIGS. 3A-B illustrate example wireless power interfaces according to embodiments of the present invention.

Figure 6A:
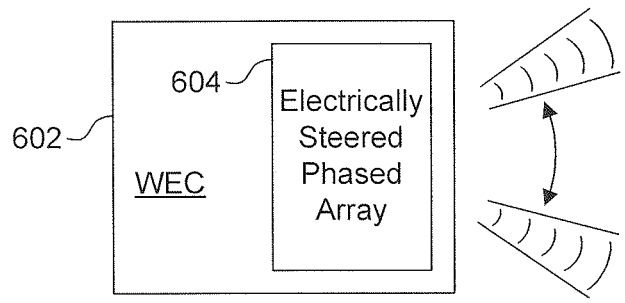
Figure 6B:
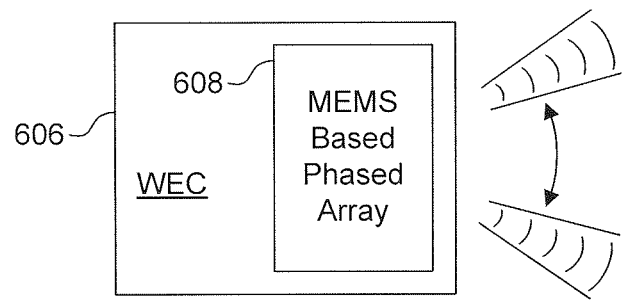
Figure 6C:
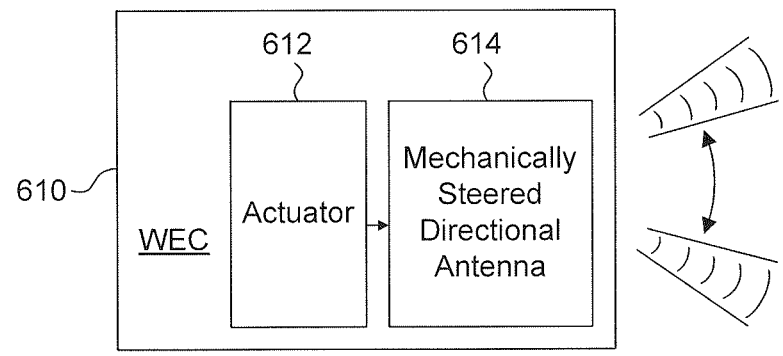

FIGS. 6A-C illustrate example WECs according to embodiments of the present invention.

Figure 7A:
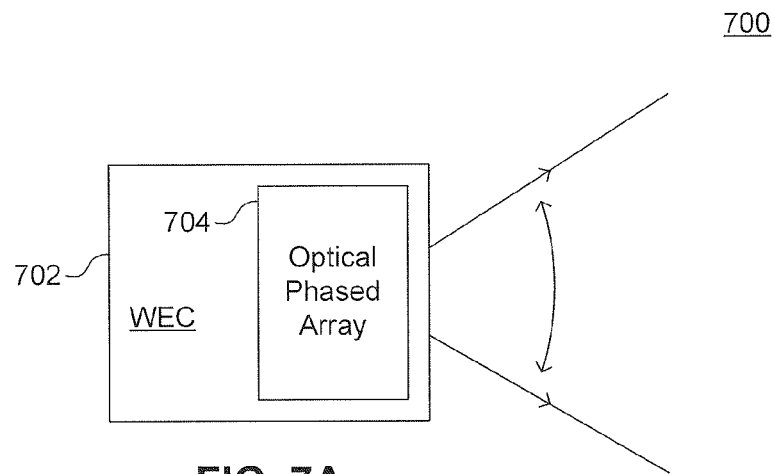
Figure 7B:
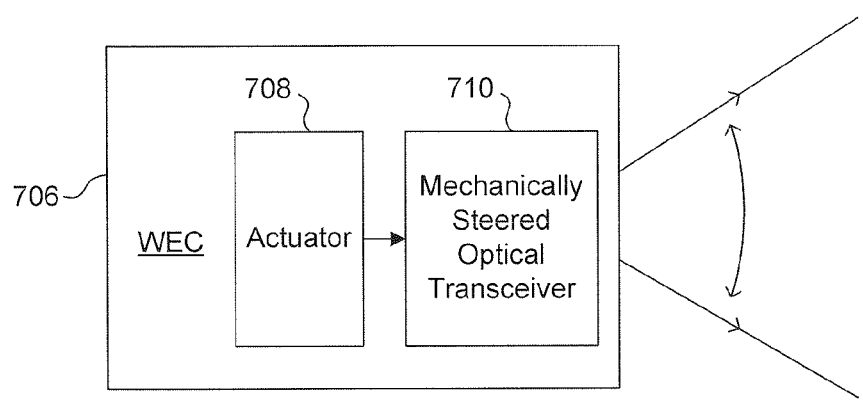

FIGS. 7A-B illustrate example WECs according to embodiments of the present invention.

Figure 8:
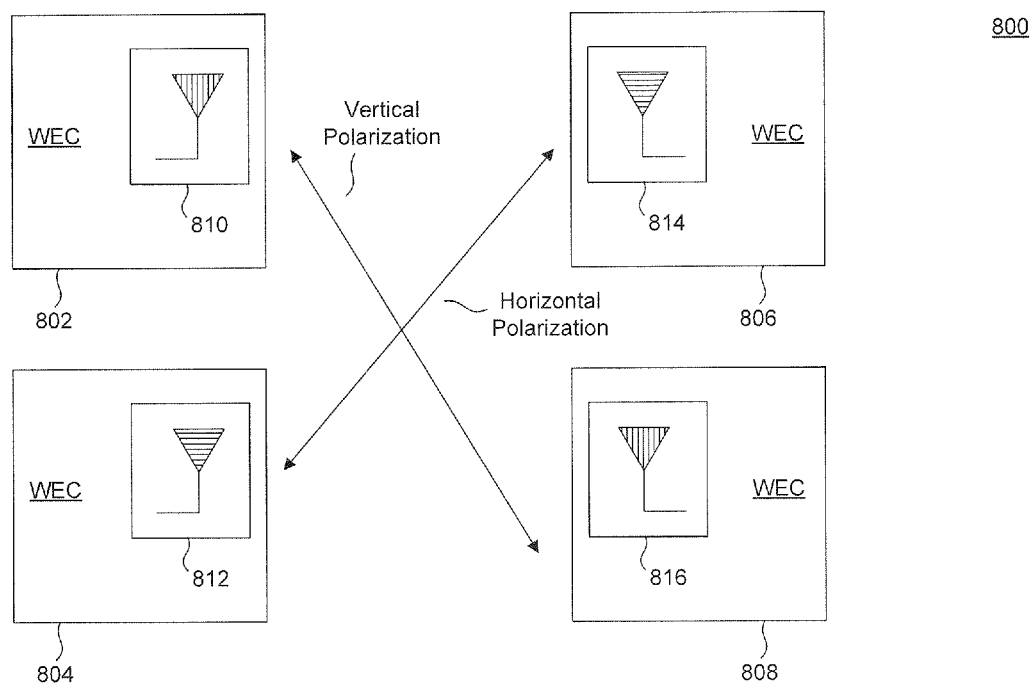

FIG. 8 illustrates an example wireless bus enabled by a plurality of WECs according to an embodiment of the present invention.

Figure 9:
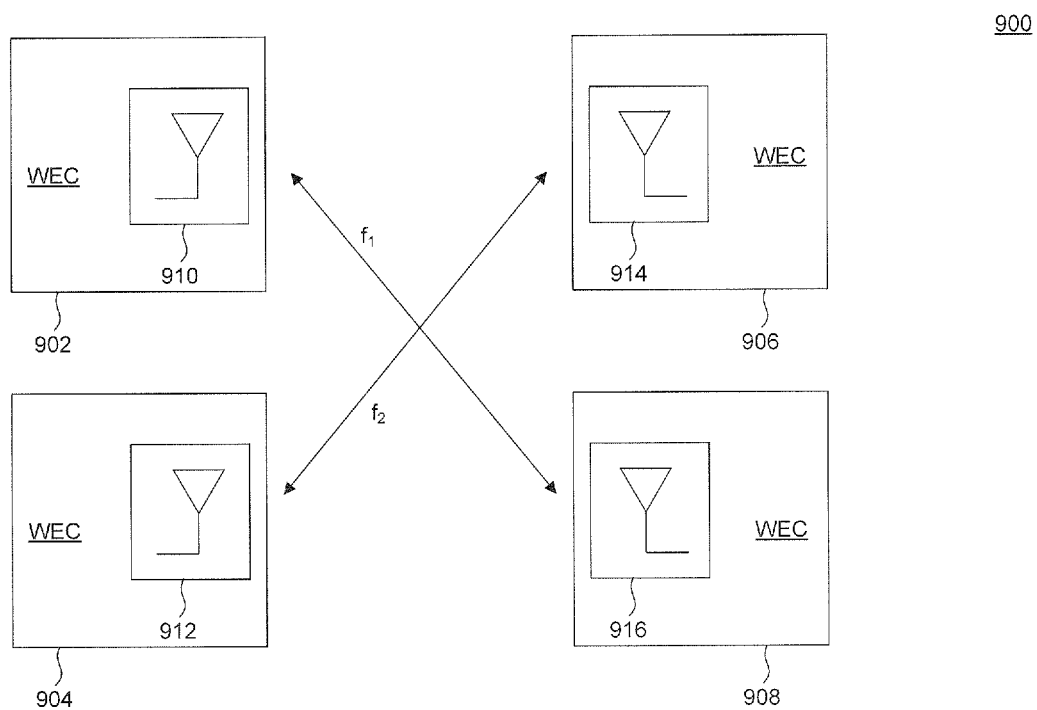

FIG. 9 illustrates an example wireless bus enabled by a plurality of WECs according to an embodiment of the present invention.

Figure 10:
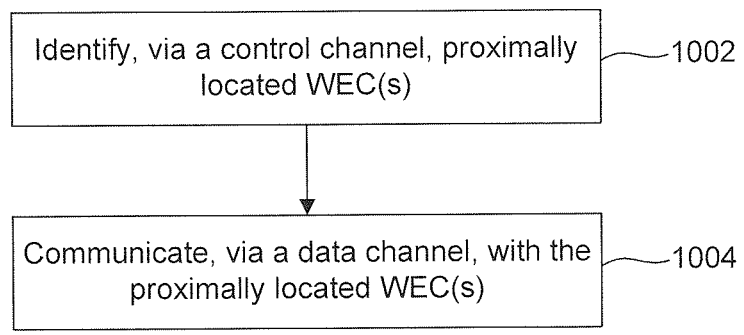

FIG. 10 illustrates an example method for establishing a link between WECs according to an embodiment of the present invention.

Figure 11A:
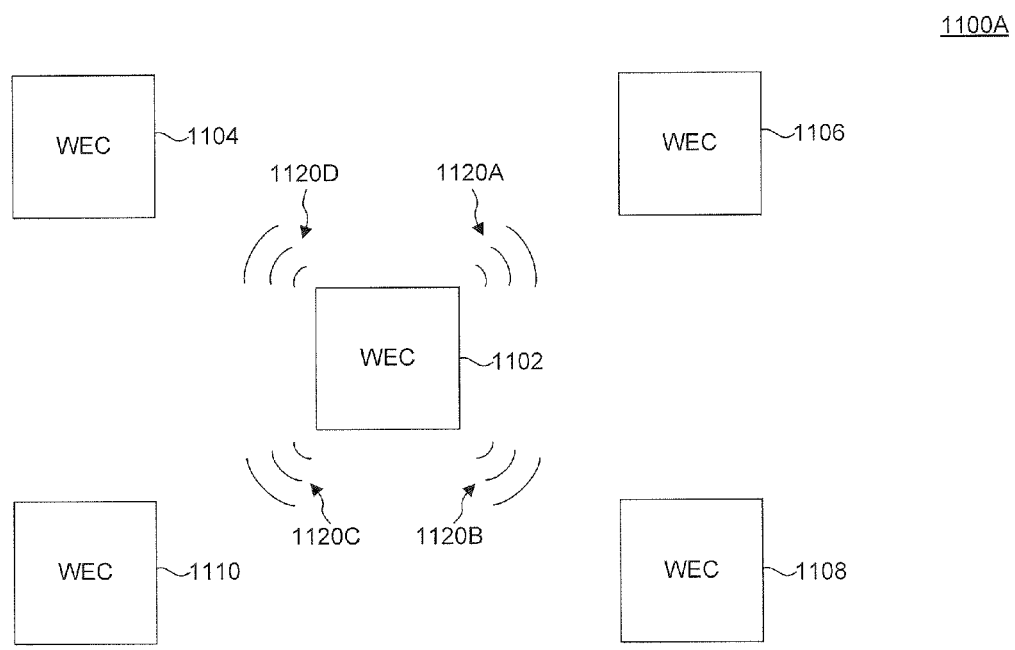

FIG. 11A illustrates a WEC that sends a request over a control channel according to an embodiment of the present invention.

Figure 11B:
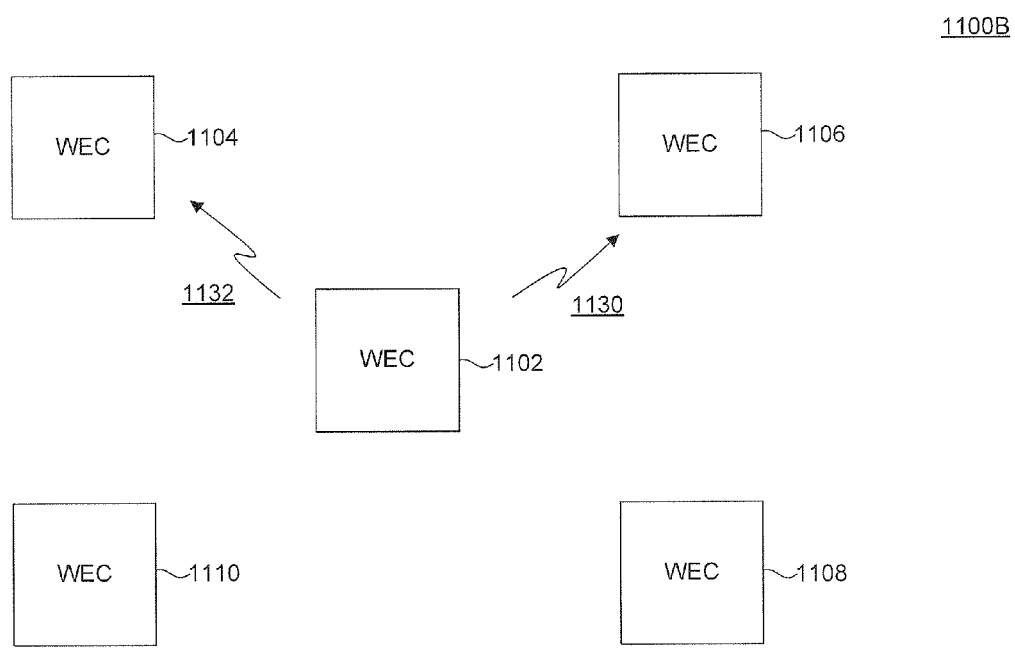

FIG. 11B illustrates a WEC that sends data over a data channel according to an embodiment of the present invention.

Figure 12:
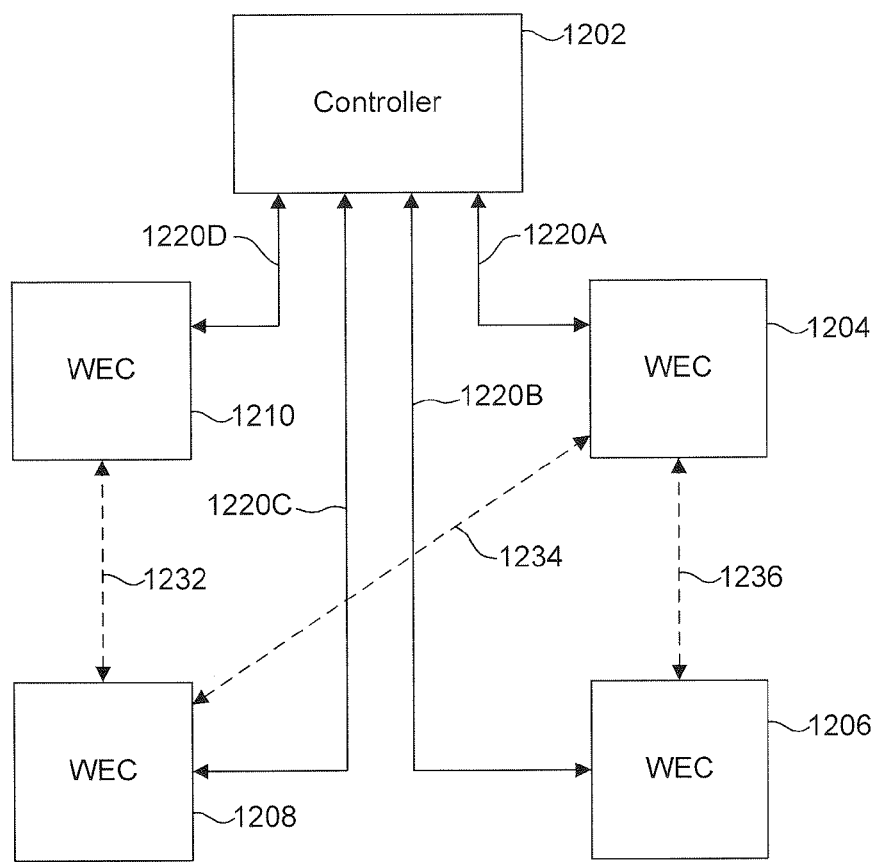

FIG. 12 illustrates a plurality of WECs configured into a field-programmable communications array according to an embodiment of the present invention.

Figure 13:
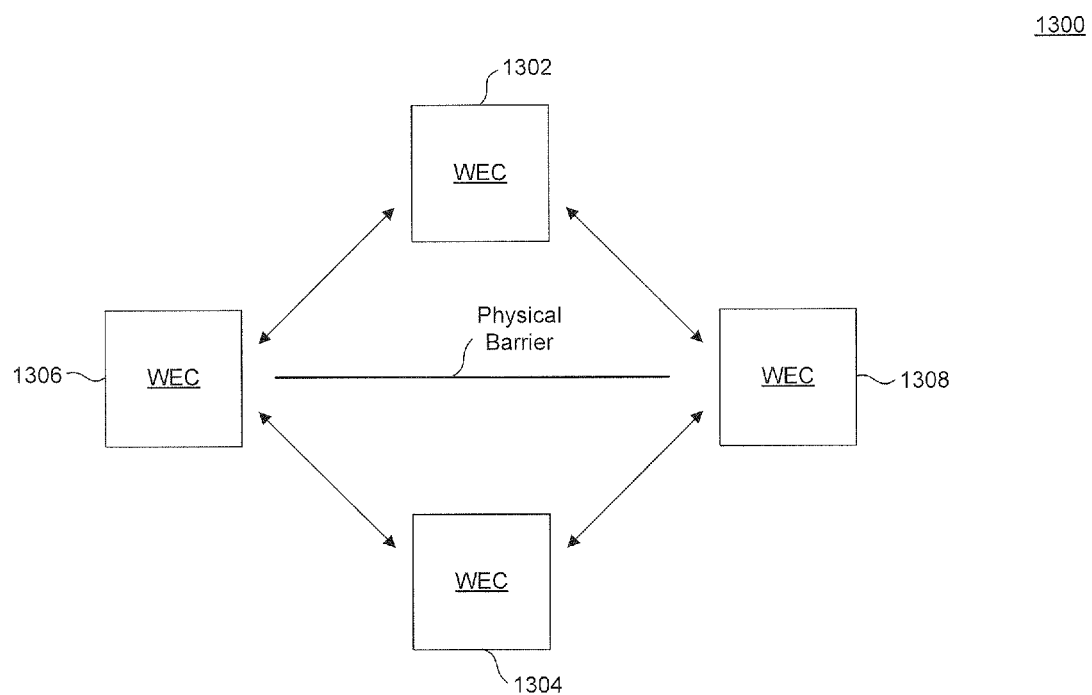

FIG. 13 illustrates an example wireless bus enabled by a plurality of WECs according to an embodiment of the present invention.

Figure 14:
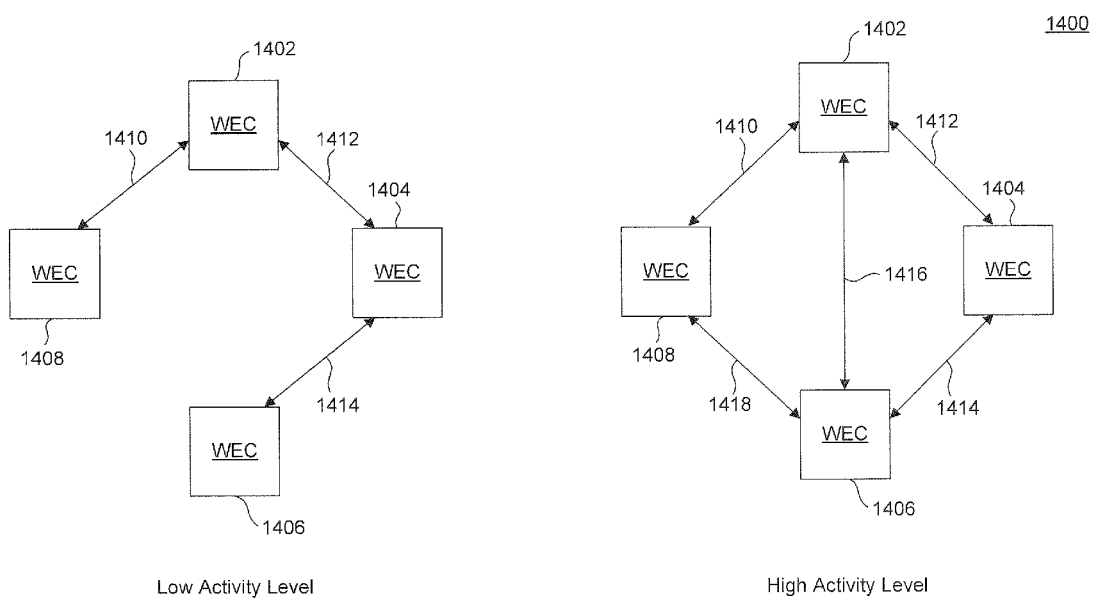

FIG. 14 illustrates an example wireless bus enabled by a plurality of WECs and adaptable according to expected activity level according to an embodiment of the present invention.

Figure 15:
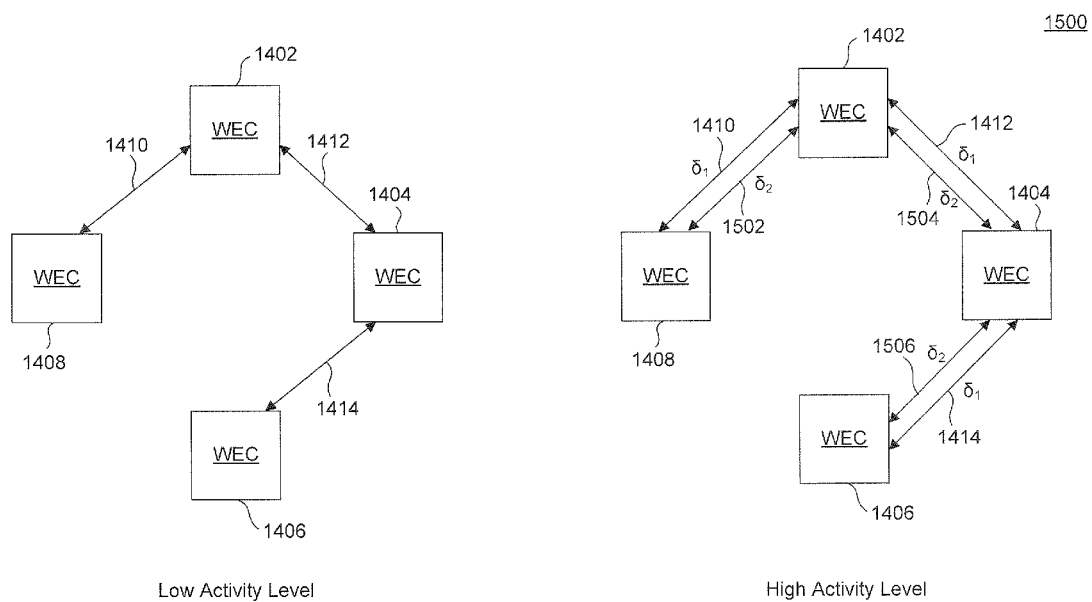

FIG. 15 illustrates an example wireless bus enabled by a plurality of WECs and adaptable according to expected activity level according to an embodiment of the present invention.

Figure 16:
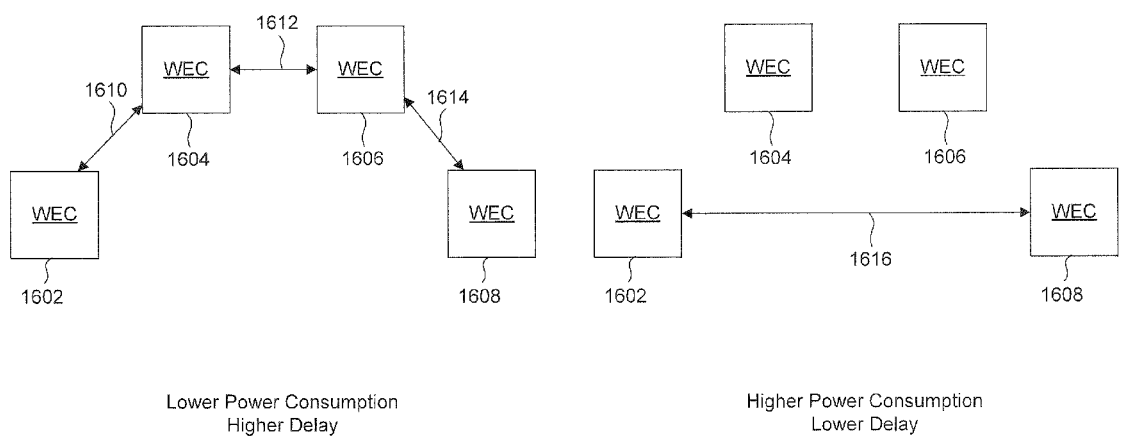

FIG. 16 illustrates an example wireless bus enabled by a plurality of WECs and adaptable according to desired power consumption or delay according to an embodiment of the present invention.

Figure 17:
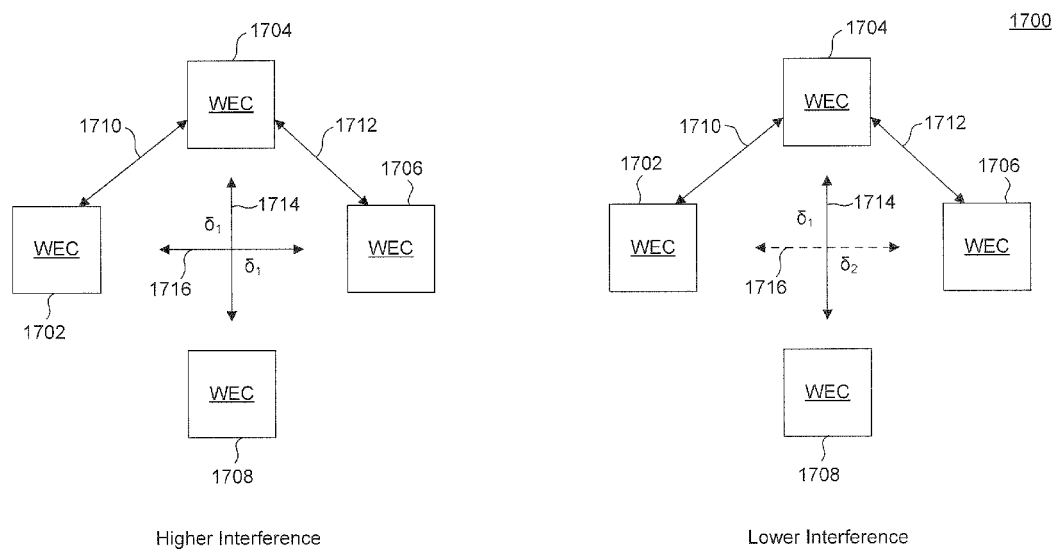

FIG. 17 illustrates an example wireless bus enabled by a plurality of WECs and adaptable according to expected interference levels according to an embodiment of the present invention.

Figure 18:
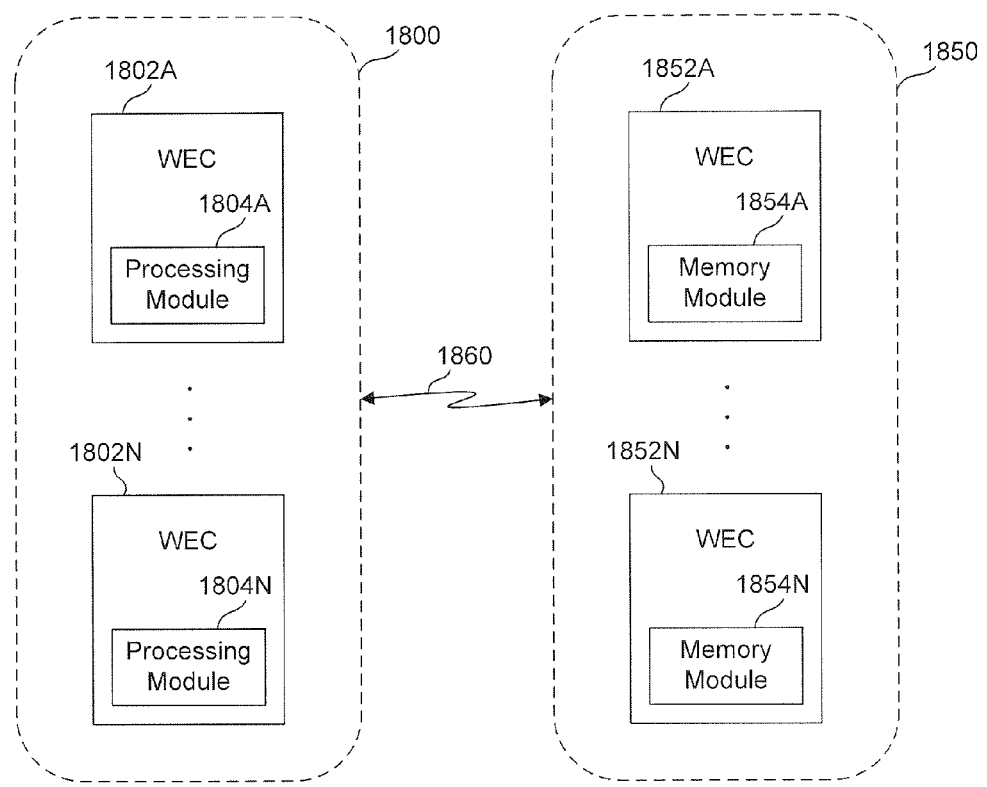

FIG. 18 illustrates a first plurality of WECs and a second plurality of WECs that communicate over a wireless bus, wherein the first plurality of WECs comprise processing resources and the second plurality of WECs comprise memory resources, according to an embodiment of the present invention.

Figure 19:
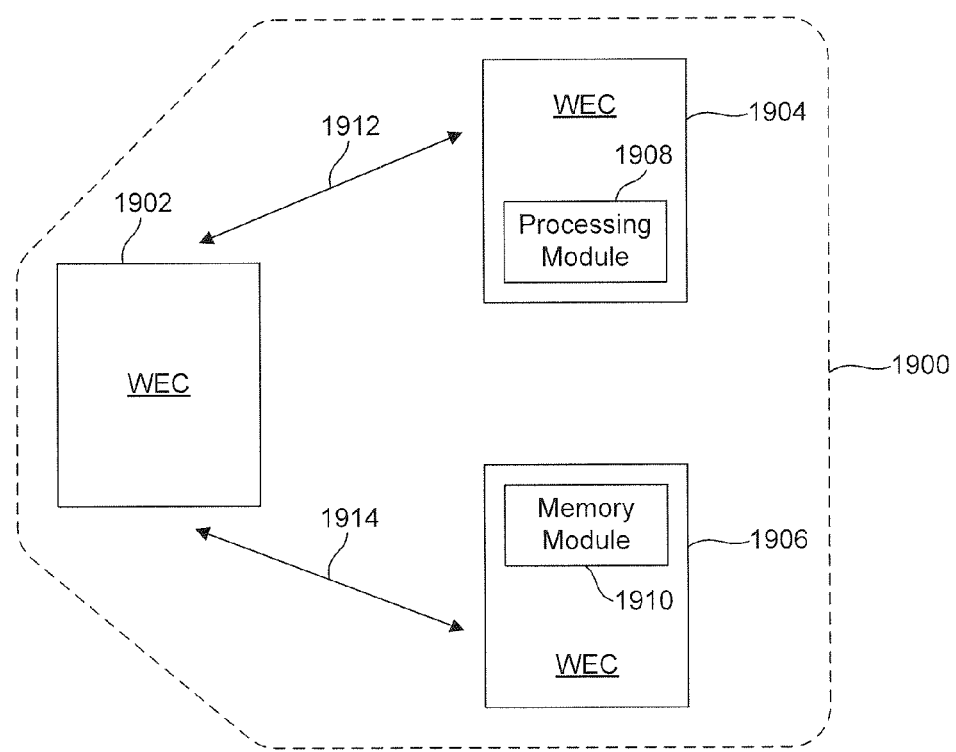

FIG. 19 illustrates an example WEC network adapted to enable resource borrowing among a plurality of WECs according to an embodiment of the present invention.

Figure 20:
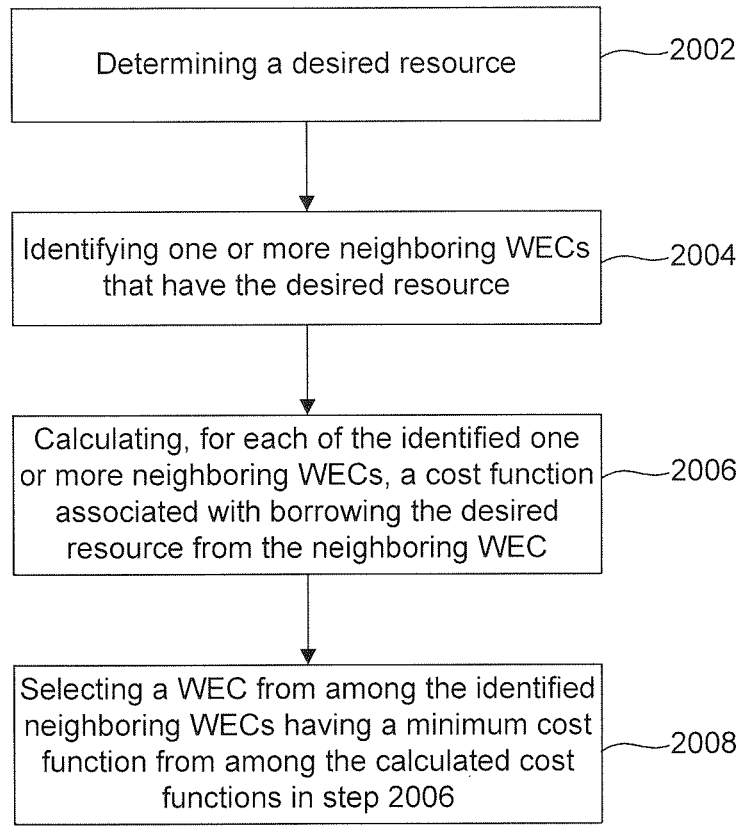

FIG. 20 is a process flowchart of a cost function-based resource borrowing method according to an embodiment of the present invention.

Figure 21:
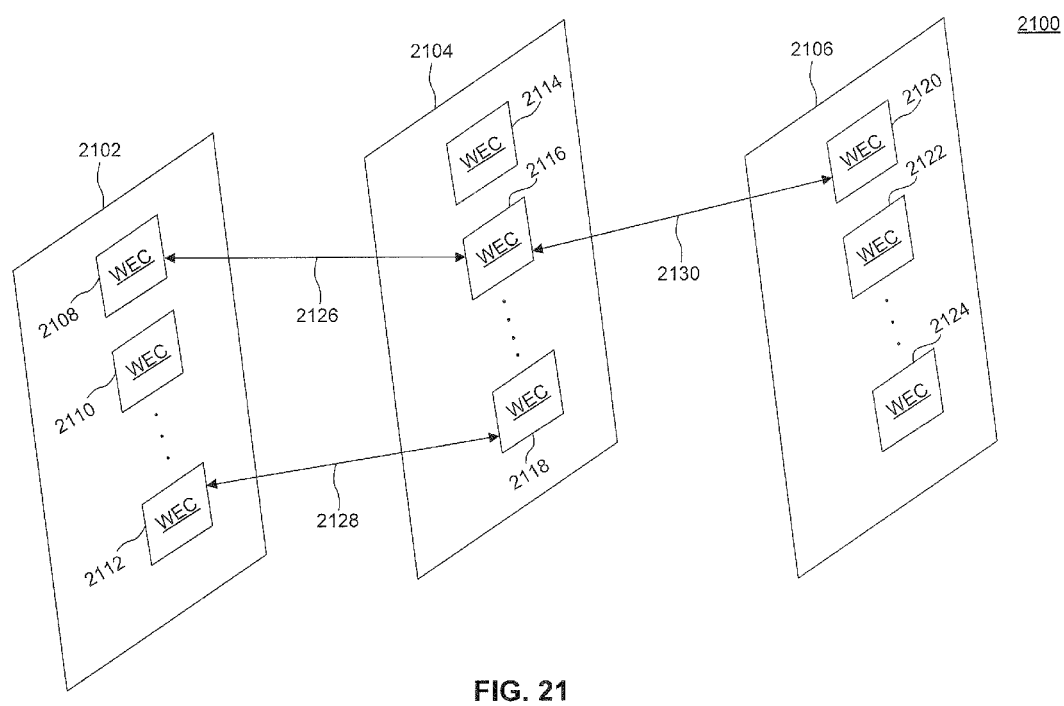

FIG. 21 illustrates an example wireless bus enabled by a plurality of WECs located in respective data units of a data server according to an embodiment of the present invention.

Figure 22:
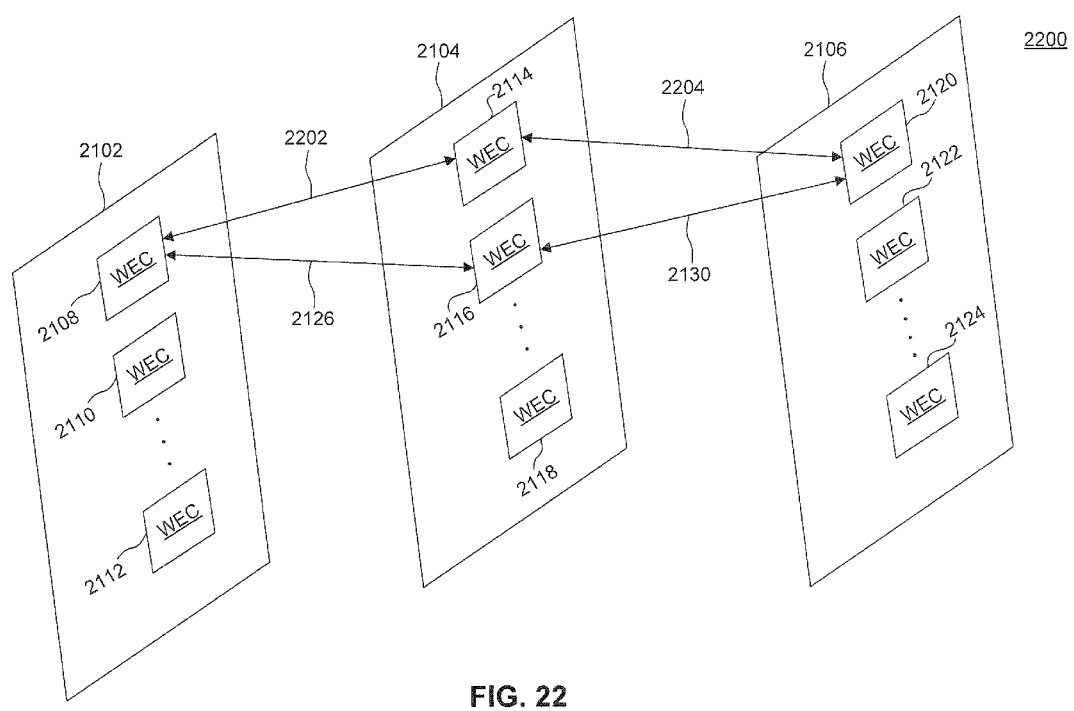

FIG. 22 illustrates an example wireless bus enabled by a plurality of WECs located in respective data units of a data server according to an embodiment of the present invention.

Figure 23:
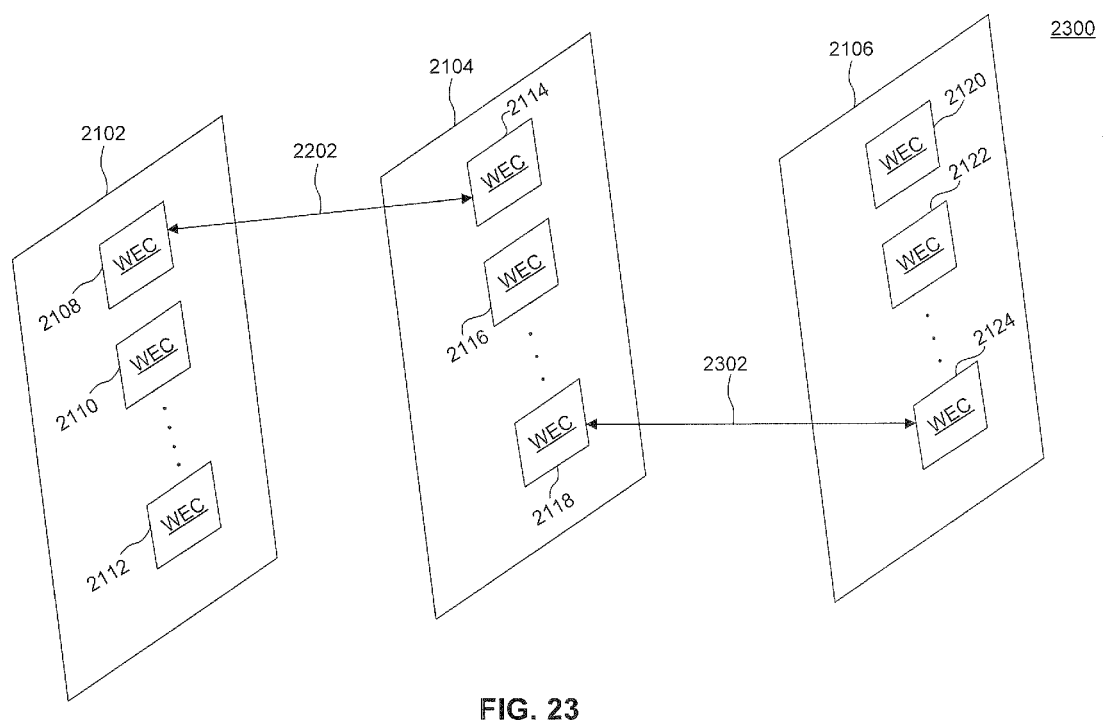

FIG. 23 illustrates an example wireless bus enabled by a plurality of WECs located in respective data units of a data server according to an embodiment of the present invention.

Figure 24:
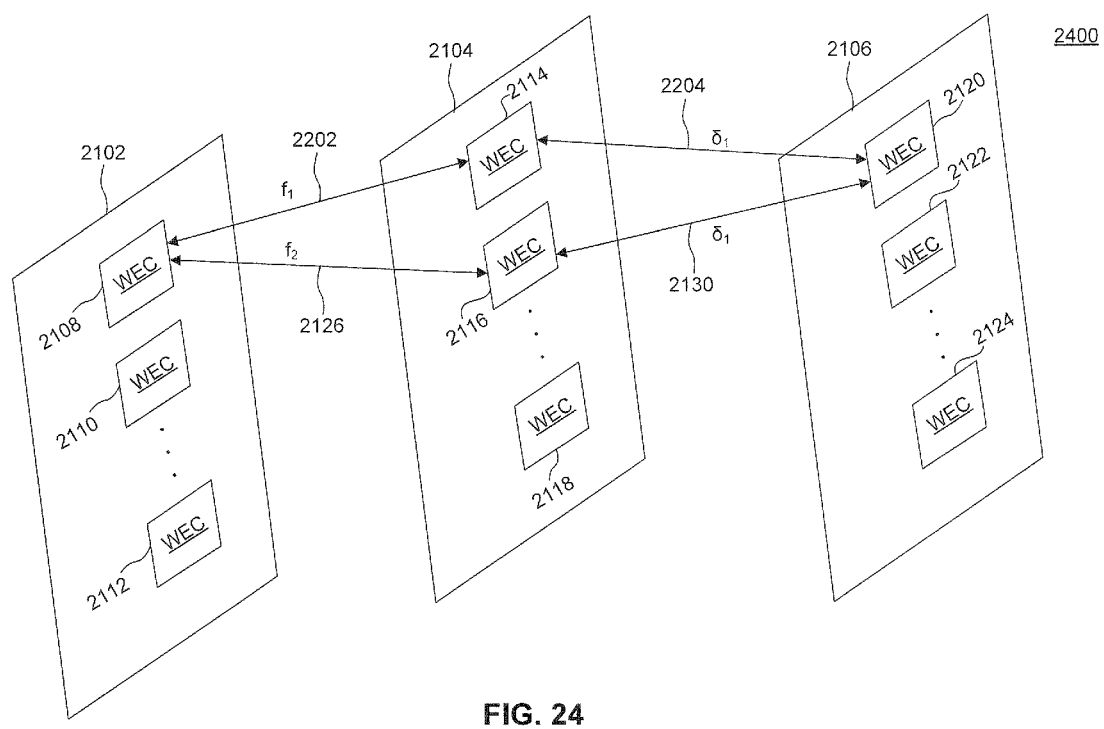

FIG. 24 illustrates an example wireless bus enabled by a plurality of WECs located in respective data units of a data server according to an embodiment of the present invention.

Figure 25:
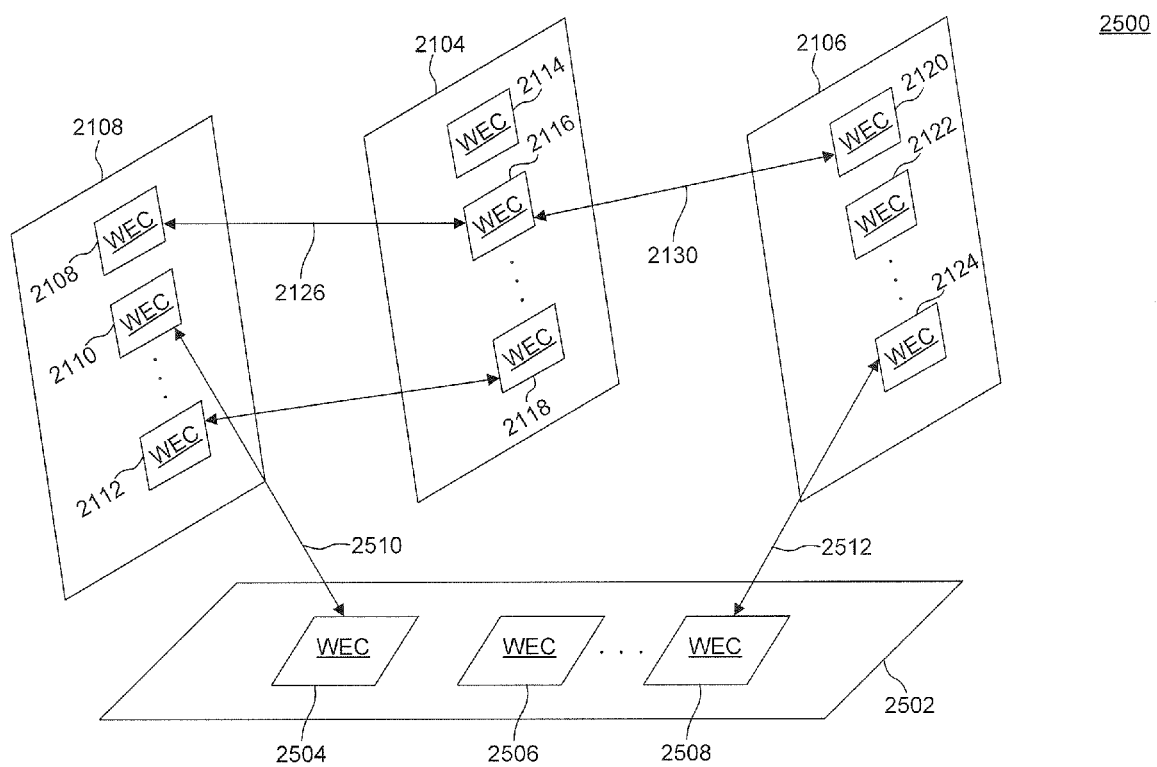

FIG. 25 illustrates an example wireless bus enabled by a plurality of WECs located in respective data units of a data server according to an embodiment of the present invention.

Figure 26:
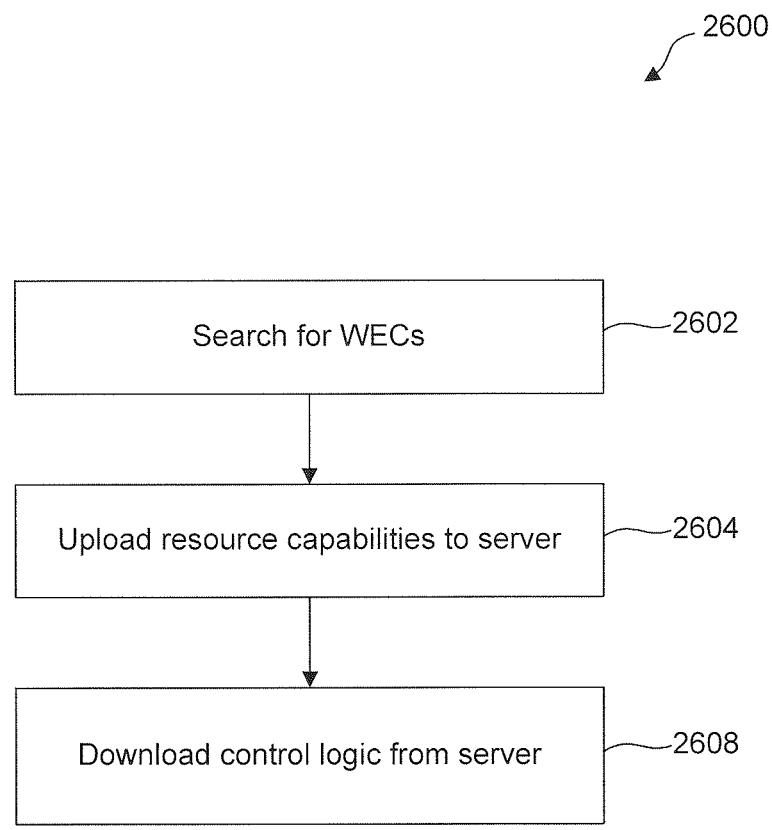

FIG. 26 illustrates an example method for creating a system on the fly using a plurality of WECs according to an embodiment of the present invention.

Embodiments of the present invention will be described with reference to the accompanying drawings. Generally, the drawing in which an element first appears is typically indicated by the leftmost digit(s) in the corresponding reference number.

DETAILED DESCRIPTION OF EMBODIMENTS

I. Overview

An embodiment of the present invention is directed to establishing a wireless communications bus, and applications thereof. In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

An embodiment of the present invention is directed to a method for establishing a wireless communication bus among a plurality of wireless-enabled components (WECs), wherein the wireless communications bus includes a plurality of links from a first WEC to each of a corresponding plurality of proximally located WECs. The first WEC and the proximally located WECs may be co-located on a single chip, in different chips on a single device, or in different devices. According to this method, a control channel (e.g., a low-speed channel) is used to identify target WECs, and a data channel (e.g., a high-speed channel) is used to communicate with the target WECs.

For example, a first WEC may transmit a signal over the control channel to identify the proximally located WECs. The control channel may be implemented using a wireless boundary scan. The control channel may also be implemented using the Standard Test Access Port and Boundary-Scan Architecture, commonly referred to as Joint Test Action Group (JTAG). The first WEC may use unidirectional signal-transmission techniques (such as, for example, an electrically steered phased array, a mechanically steered phased array, etc.) to sequentially scan an environment surrounding the first WEC. Additionally or alternatively, the first WEC may use omni-directional signal-transmission techniques (such as, for example, a locating beacon, etc.) to scan the surrounding environment of the first WEC.

After transmitting the signal, the first WEC may receive one or more responses from one or more proximally located WECs. For example, the proximally located WECs may simply scatter the signal transmitted by the first WEC. Additionally or alternatively, the proximally located WECs may include an element (e.g., an antenna) to backscatter transmit the signal transmitted by the first WEC or to send a return transmission back to the first WEC. In any event, the scattered signals, the backscatter-transmitted signals, and/or the return-transmission signals from the proximally located WECs are received by the first WEC.

Based on the received signals, the relative position and/or capabilities of the proximally located WECs may be determined. The relative position of a proximally located WEC includes the direction of the proximally located WEC with respect to the first WEC and may optionally include the distance between the proximally located WEC and the first WEC. The direction information is useful for directional-communication techniques (such as, for example, beamforming and line-of-sight communications). The distance information is useful for determining an appropriate signal strength for communications between the first WEC and a proximally located WEC.

The relative position of the proximally located WECs may be determined using techniques similar to radar. In one embodiment, the first WEC includes a locating module (e.g., hardware and/or software) to determine the relative position of the proximally located WECs. In another embodiment, an external computing resource assists the first WEC in determining the relative position of each of the proximally located WECs. In a further embodiment, the relative position of the proximally located WEC is computed by a computing resource other than the first WEC. In this further embodiment, for example, the first WEC may forward the received signals to the computing resource. The computing resource may then determine the relative position of each of the proximally located WECs based on the received signals and forward the location information back to the first WEC.

After the relative position of the proximally located WECs is determined, the first WEC communicates with at least one of the proximally located WECs over the data channel. In an embodiment, a communication mechanism (e.g., beamforming, optical, etc.) used to communicate over the data channel is selected based on the relative position and capabilities of the proximally located WECs.

Before providing additional description regarding establishing communications links with proximally located WECs, it is first helpful to describe an example wireless bus and WECs according to embodiments of the present invention.

II. Wireless Bus

Figure 1:
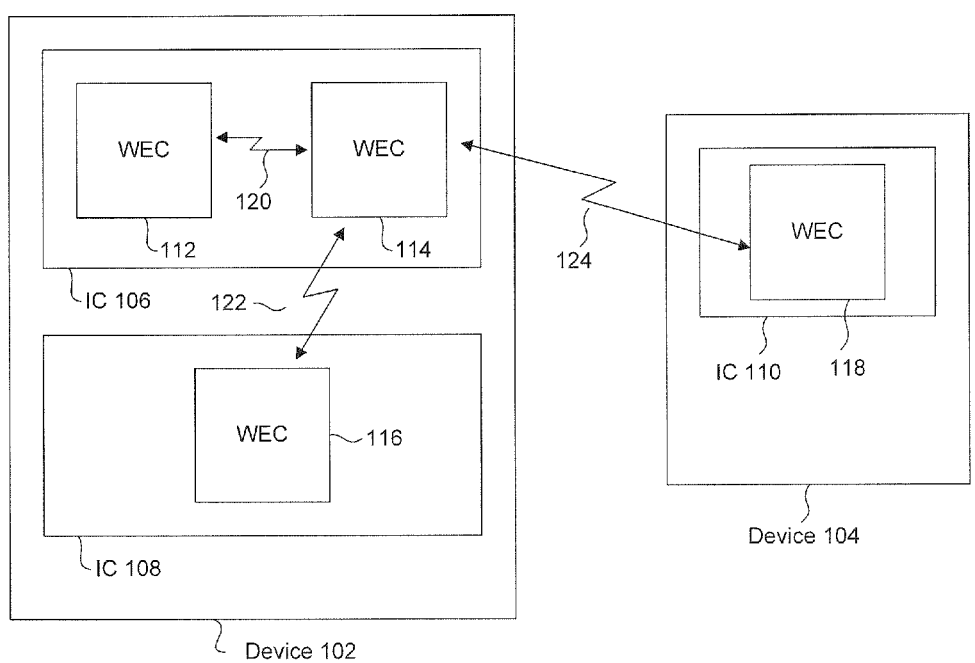

FIG. 1 illustrates an example wireless bus 100 according to an embodiment of the present invention. As shown in FIG. 1, example wireless bus 100 is enabled by a plurality of wireless-enabled components (WECs) 112, 114, 116, and 118 and a plurality of wireless links 120, 122, and 124 that connect WECs 112, 114, 116, and 118. WECs 112, 114, 116, and 118 each includes wireless data communication means.

Wireless bus 100 enables intra-chip, inter-chip, and inter-device wireless communication between WECs. For example, communication between WEC 112 and WEC 114 via wireless link 120 represents intra-chip communication as it takes place within a single IC 106. Communication between WEC 114 and WEC 116 via wireless link 122 represents inter-chip communication as it takes place between WECs located in separate ICs 106 and 108 but within a same device 102. Communication between WEC 114 and WEC 118 via link 124 represents inter-device communication as it takes place between WECs located in separate ICs 106 and 110 and in separate devices 102 and 104.

Wireless bus 100 may be enabled by homogeneous and/or heterogeneous WECs and by homogeneous and/or heterogeneous wireless links. For example, WECs 112, 114, 116, and 118 may have same or different wireless or wired communication capabilities, processing capabilities, powering mechanisms, functionalities, etc. Further, WECs 112, 114, 116, and 118 may be located within same or different type of devices and/or within devices of same or different device ecosystems. Similarly, wireless links 120, 122, and 124 may be of same or different type as further described below.

III. Wireless-enabled Components

A WEC is an element for enabling a wireless bus according to embodiments of the present invention. As used herein, a WEC encompasses a functional block of an IC (such as, for example, a processing core of a processing unit), an entire IC (such as, for example, a processing unit), or a device that includes a plurality of ICs (such as, for example, a handheld device). According to embodiments, a WEC may be associated with one or more sub-blocks of an IC, a single IC, or a plurality of IC. Example WECs according to embodiments of the present invention are presented below. These examples are provided for the purpose of illustration only and are not limiting of the scope of embodiments of the present invention. Further, any variations and/or improvements that would be apparent to a person of skill in the art based on the teachings herein are also within the scope of embodiments of the present invention.

Figure 2A:
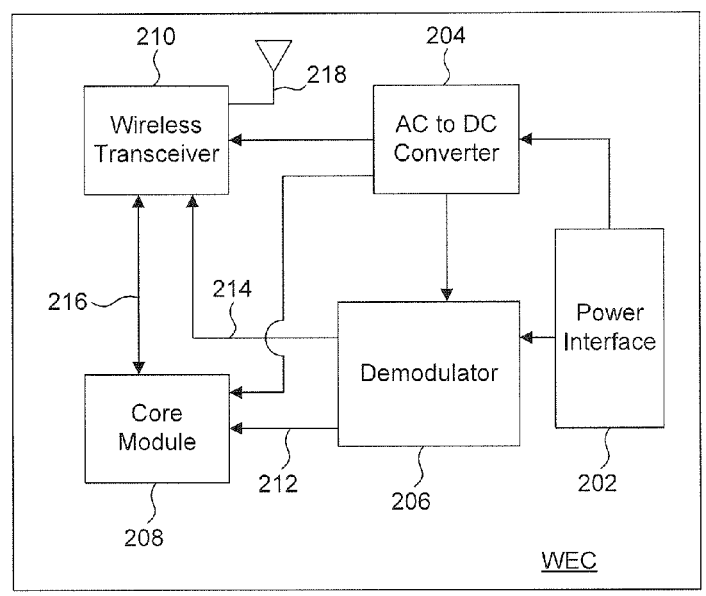

FIG. 2A illustrates an example WEC 200A according to an embodiment of the present invention. As shown in FIG. 2A, example WEC 200A includes a power interface 202, an AC to DC converter 204, a demodulator 206, a core module 208, a wireless transceiver 210, and an antenna element 218.

Power interface 202 serves to receive and provide power to WEC 200A. In an embodiment, power interface 202 comprises a direct power attachment, in which there is no power conditioning. In another embodiment, power interface 202 receives power in AC form from an external AC power source. Power interface 202 conveys the received AC power to AC to DC converter 204.

AC to DC converter 204 converts the AC power received from power interface 202 into DC form. In an embodiment, AC to DC converter 204 also includes one or more storage elements (not shown) for storing the energy from the converted DC power. AC to DC converter 204 then powers up the different components of WEC 200A. For example, as shown in FIG. 2A, AC to DC converter 204 provides power to demodulator 206, core module 208, and wireless transceiver 210 to power them up.

According to embodiments, core module 208 and wireless transceiver 210 are configurable in real time upon power up and/or during operation, as described below, for example, with respect to FIG. 12. In an embodiment, as illustrated in FIG. 2A, configuration of core module 208 and wireless transceiver 210 is performed via power interface 202 and demodulator 206. In particular, the configuration includes the steps of modulating (e.g., amplitude modulating) the power received by power interface 202 to convey configuration information; demodulating the received power by demodulator 206 to generate configuration information; and providing the generated configuration information from demodulator 206 to core module 208 and wireless transceiver 210. In an embodiment, the generated configuration information includes configuration information 212 provided to core module 208 and configuration information 214 provided to wireless transceiver 210.

Alternatively, core module 208 and wireless transceiver 210 are pre-configured at manufacture time. Accordingly, demodulator 206 may be optional.

Core module 208 represents the functional module of WEC 200A. For example, core module 208 may include a microprocessor, microcontroller, digital signal processor, programmable logic circuit, memory, application specific integrated circuit (ASIC), analog to digital converter (ADC), digital to analog converter (DAC), digital logic circuitry, etc.

Wireless transceiver 210 may be any transceiver (i.e., transmitter and receiver) capable of wireless communication. For example, wireless transceiver 210 may be a free-space RF transceiver, a waveguide RF transceiver, or an optical transceiver, for example. Wireless transceiver 210 communicates with core module 208 via an interface 216. In particular, wireless transceiver 210 receives over a wireless bus (such as wireless bus 100, for example) communication destined to core module 208, and forwards the received communication to core module 208 via interface 216. In addition, wireless transceiver 210 receives communication from core module 208 via interface 216, and transmits the communication wirelessly over the wireless bus to its intended destination. In an embodiment, interface 216 is a wired connection. In another embodiment, interface 216 is a proximity coupling, as described in more detail below with respect to FIG. 4.

Wireless transceiver 210 uses a wireless antenna 218 to wirelessly transmit and receive communication over the wireless bus. Wireless antenna 218 may be any wireless antenna, including, for example, an electromagnetic wave (e.g., RF) antenna or an optical antenna. The electromagnetic (EM) wave antenna may be a free-space RF antenna or a waveguide coupler, for example. In addition, as further discussed below, wireless antenna 218 may include one or more antenna structures configurable to enable beamforming and directional communication.

Figure 2B:
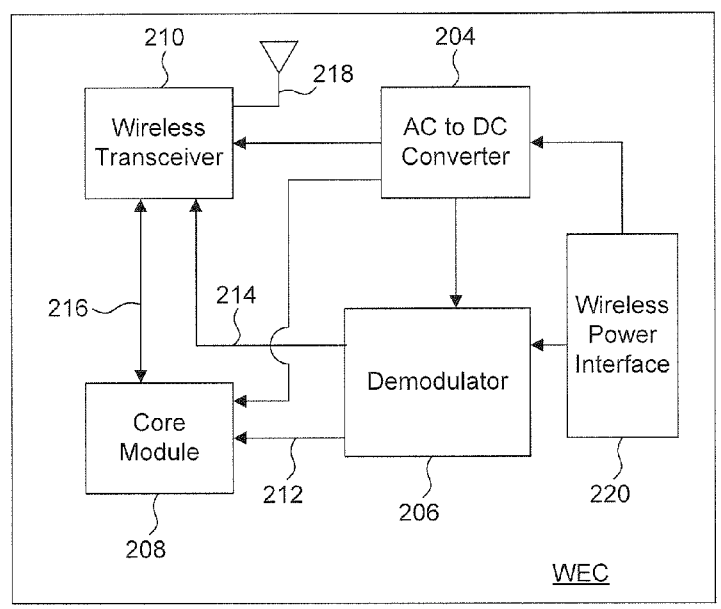

FIG. 2B illustrates another example WEC 200B according to an embodiment of the present invention. Example WEC 200B is substantially similar to example WEC 200A, described above with reference to FIG. 2A. In addition, example WEC 200B uses a wireless power interface 220 for power interface 202.

Wireless power interface 220 functions similarly to power interface 202, described above with reference to FIG. 2B. In addition, however, wireless power interface 220 has the ability to receive power wirelessly from an external power source. Accordingly, example WEC 200B requires no wired connections with the outside environment to operate according to its intended functionality. This includes requiring no wired communication interfaces/buses to communicate with the outside environment and no wired power connections/interfaces to receive power from the outside environment.

Figure 3A:
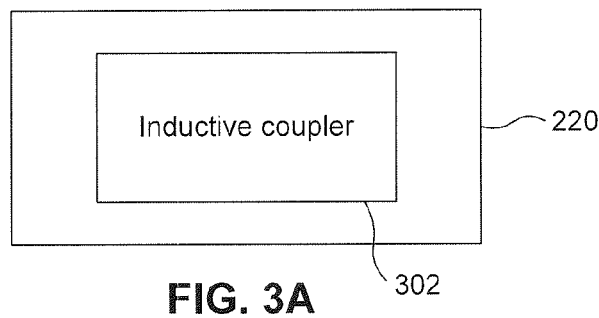
Figure 3B:
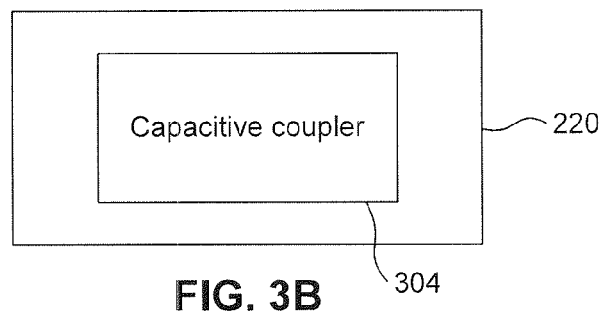

According to embodiments, wireless power interface 220 may be any interface capable of receiving wireless power. For example, as shown in FIG. 3A, wireless power interface 220 may include an inductive coupler 302 (e.g., a coil). Alternatively or additionally, wireless power interface 220 may include a capacitive coupler 304, as shown in FIG. 3B, for example. These examples are provided for the purpose of illustration only and are not limiting of the scope of embodiments of the present invention. Further, any variations and/or improvements that would be apparent to a person of skill in the art based on the teachings herein are also within the scope of embodiments of the present invention.

Figure 4:
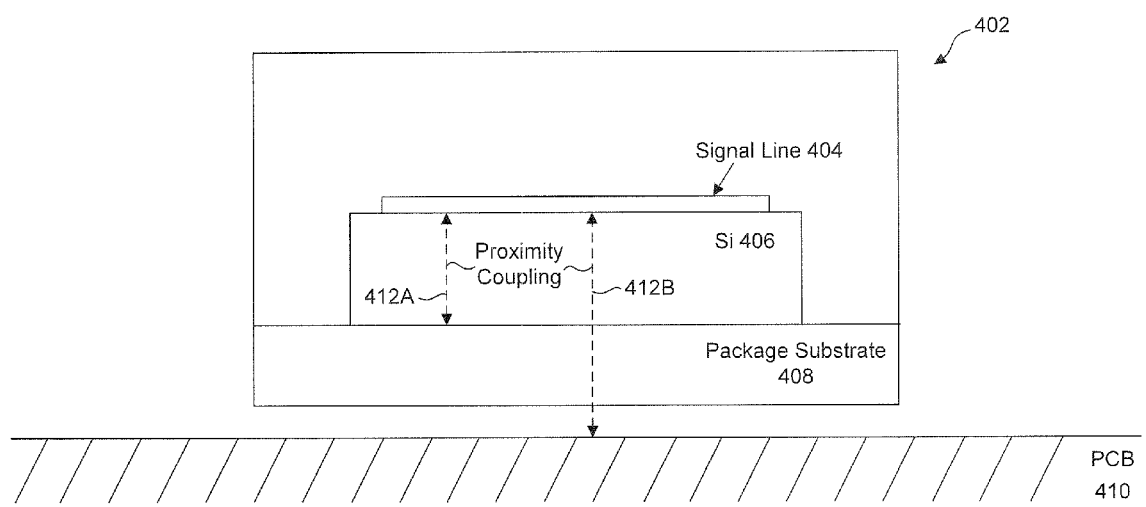
FIG. 4 illustrates an example WEC having an internal element that is wirelessly coupled to an outside environment in accordance with an embodiment of the present invention.

FIG. 4 illustrates an example WEC having an internal element that is wirelessly coupled to an outside environment in accordance with an embodiment of the present invention. In the example of FIG. 4, the WEC is illustrated as a chip enclosed in a package 402. Referring to FIG. 4, included within package 402 is a silicon layer 406 and a signal line 404. Silicon layer 406 comprises transistors/logic of the chip. Signal line 404 is configured to route signals between the transistors/logic of silicon layer 406 and between silicon layer 406 and an outside environment. To route signals to the outside environment, there is a proximity coupling 412A between signal line 404 and package substrate 408, and there is (optionally) a proximity coupling 412B between signal line 404 and a printed circuit board (PCB) 410. Proximity couplings 412 may comprise a magnetic coupling (e.g., an inductive coupling), an electric coupling (e.g., a capacitive coupling), an electromagnetic coupling, and/or a combination thereof. By way of proximity coupling 412, the WEC of FIG. 4 may transmit signals to, and receive signals from, an outside environment (e.g., package substrate 408 and/or PCB), without having an Ohmic contact with the outside environment.

It is to be appreciated that the WEC of FIG. 4 is illustrated as a chip for illustrative purposes only, and not limitation. As set forth herein, WECs are not limited to chips, but also include functional blocks of a chip (such as, for example, a processing core of a processing unit) and devices that include chips (such as, for example, handheld devices). Any of these types of WECs may be proximity coupled to an outside environment.

IV. Wireless Links

As mentioned above, a plurality of WECs may be wirelessly coupled into a system via a wireless communications bus. The wireless communications bus comprises a plurality of wireless communications links among the WECs. Described below are (A) example types of links among the WECs and (B) example methods for establishing a link between WECs.

A. Example Types of Links

According to embodiments, links between WECs in a wireless bus can be any type of wireless links, including RF links, optical links, and links enabled by proximity coupling. Further, a WEC may include one or more types of wireless communication means, which may be used to enable simultaneously one or more types of wireless communication links between the WEC and other WECs.

Figure 5:
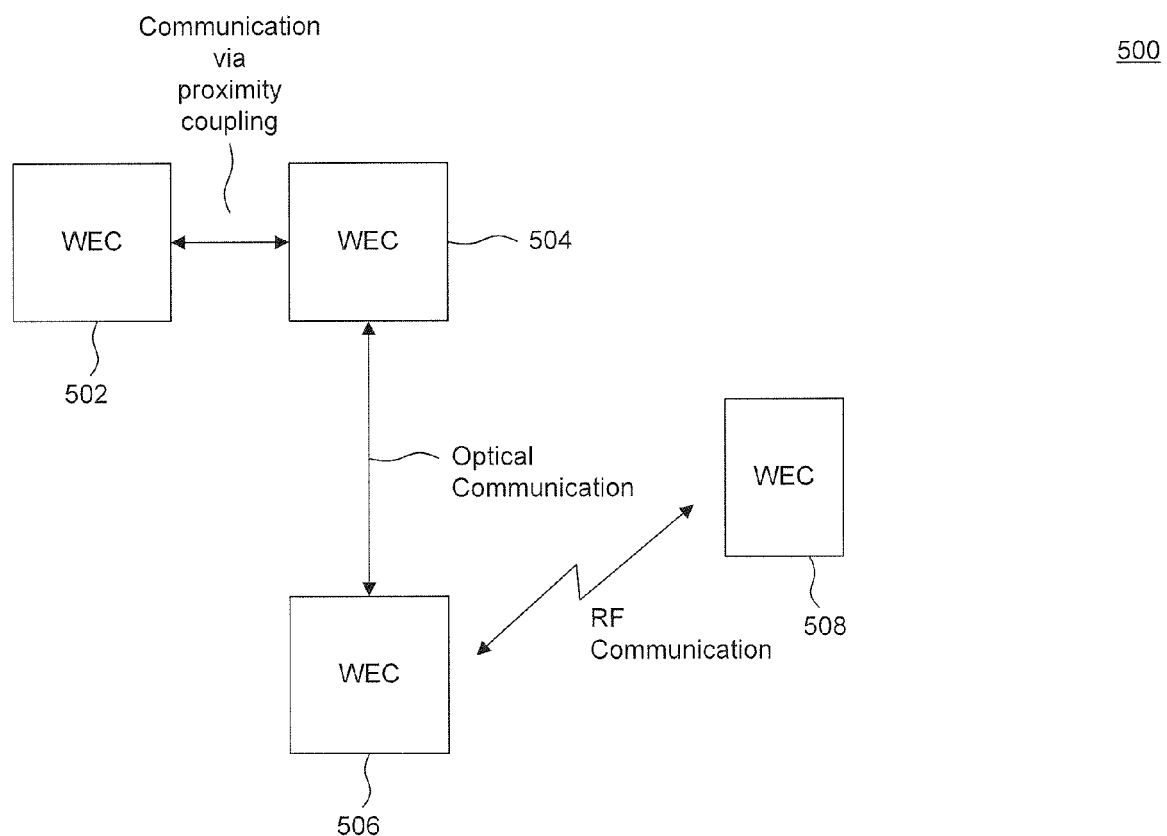
FIG. 5 illustrates an example wireless bus enabled by a plurality of WECs according to an embodiment of the present invention.

For illustration, FIG. 5 shows an example wireless bus 500 enabled by a plurality of WECs 502, 504, 506, and 508 according to an embodiment of the present invention.

Referring to FIG. 5, WEC 502 and WEC 504 communicate wirelessly via proximity coupling within wireless bus 500. In an embodiment, WEC 502 and 504 communicate by means of near field magnetic induction, whereby communication between WEC 502 and WEC 504 is accomplished using a low-power, non-propagating magnetic field. In particular, each of WEC 502 and WEC 504 may include a transmitter coil and a receiver coil. To transmit information, the transmitter coil of the transmitting WEC is used to modulate a magnetic field, which is measured by the receiving coil at the receiving WEC.

Still referring to FIG. 5, WEC 504 may additionally include means to communicate optically, which it uses to communicate with WEC 506. Thus, WEC 504 may communicate simultaneously with both WEC 502 and WEC 506 using two different types of wireless communication. In an embodiment, WEC 504 and WEC 506 each includes an optical transceiver to enable the optical communication link between them. WEC 506 may additionally include RF communication means, which it uses to communicate with WEC 508. Thus, WEC 506 may communicate simultaneously with both WEC 504 and WEC 508 using two different types of wireless communication.

By enabling different types of wireless communication links within wireless bus 500, both the capacity and the reliability of communication can be increased and interference can be decreased. The same can also be achieved by using antenna diversity schemes within the wireless bus as further discussed below.

In an embodiment, pattern diversity is used within the wireless bus. In particular, pattern diversity includes using pattern shaping (e.g., beamforming and/or adaptive nulling) and/or directional beam transmission to reduce interference, increase communication range between the WECs, and enable greater directional communication between the WECs. Beamforming is a special case of patterning shaping. Adaptive nulling puts a null of a radiation pattern in the direction of an interference source, thereby reducing the received level of interference.

According to embodiments, to enable RF beamforming, a WEC may include one or more of RF phased arrays, each including a plurality of co-located RF antennas. For example, as illustrated by example WEC 602 in FIG. 6A, the WEC may include an electrically steered phased array 604, which can be controlled electrically to create a desired beamforming pattern in a desired transmission direction. Typically, phased array 604 is controlled by means of a plurality of micro phase shifters (not shown in FIG. 6A).

Alternatively or additionally, the WEC may include a mechanically steered phased array, such as a MEMS-based phased array 608, as illustrated by example WEC 606 in FIG. 6B.

Further, optical beamforming can be enabled by the WEC using an optical phased array 704, as illustrated by example WEC 702 in FIG. 7A. Optical phased array 704 can be electrically steered or mechanically steered.

To enable directional RF beam transmission, a WEC may include one or more directional RF antennas. Further, according to embodiments, the one or more directional RF antennas can be steered to provide a greater range of RF directional transmission. For example, as illustrated by example WEC 610 in FIG. 6C, the WEC may include a mechanically steered directional antenna 614. The WEC may further include an actuator 612 for steering directional antenna 614 in a desired transmission direction. In an embodiment, actuator 612 is MEMS-based.

Similarly, a greater range of optical directional transmission can be enabled by equipping the WEC with one or more mechanically steered optical transceivers. For example, as illustrated by example WEC 706 in FIG. 7B, the WEC may include a mechanically steered optical transceiver 710, and an actuator 708 for controlling optical transceiver 710. In an embodiment, actuator 708 is MEMS-based.

Polarization diversity is another antenna diversity scheme which can be used within the wireless bus according to embodiments to further increase the wireless bus capacity and reliability and to reduce interference.

FIG. 8 illustrates an example wireless bus 800 enabled by a plurality of WECs 802, 804, 806, and 808 according to an embodiment of the present invention. As shown in FIG. 8, WECs 802, 804, 806, and 808 include respective antenna elements 810, 812, 814, and 816.

According to embodiments, polarization diversity is achieved by using orthogonal polarizations over the links of the wireless bus. For example, as shown in FIG. 8, antenna elements 810 and 816 of WECs 802 and 808, respectively, are configured to use vertical polarization to communicate with each other, while antenna elements 812 and 814 of WECs 804 and 806, respectively, are configured to use horizontal polarization to communicate with each other. Accordingly, communication between WEC 802 and WEC 808 and communication between WEC 804 and 806 can take place concurrently without causing interference to one another. Further, the capacity and reliability of wireless bus 800 is increased. In particular, in the example of FIG. 8, the capacity of wireless bus 800 is doubled by the example polarization diversity scheme as shown.

It is noted that polarization diversity according to embodiments is based on assigning polarization on a link basis. Thus, the antenna element of particular WEC may use different polarizations on different communication links. This includes using different polarizations to communicate with different WECs and/or using different polarizations to communicate with a single WEC (i.e., a first polarization to transmit, and a second polarization to receive).

In embodiments, the polarization diversity scheme used within the wireless bus can be adapted dynamically according to one or more of data traffic patterns, desired capacity, interference levels, etc. For example, referring to FIG. 8, a polarization diversity scheme as shown may be used when expected data traffic patterns indicate that heavy data traffic occurs between WEC 802 and WEC 808 and between WEC 804 and WEC 806. However, a different polarization diversity scheme may be adopted when data traffic patterns necessitate a change. Similarly, the polarization diversity scheme shown in FIG. 8 may be adapted dynamically for capacity and/or interference considerations. As a result of the adaptive aspect of polarization diversity, links within the wireless bus are configured based on polarization in real-time.

Frequency diversity is another antenna diversity scheme which is enabled according to embodiments to increase the wireless bus capacity and reliability and to reduce interference.

FIG. 9 illustrates an example wireless bus 900 enabled by a plurality of WECs 902, 904, 906, and 908 according to an embodiment of the present invention. As shown in FIG. 9, WECs 902, 904, 906, and 908 include respective antenna elements 910, 912, 914, and 916.

According to embodiments, frequency diversity is achieved by using different communication frequencies over the links of the wireless bus. For example, as shown in FIG. 9, antenna elements 910 and 916 of WECs 902 and 908, respectively are configured to use a first frequency $f_1$ to communicate with each other, while antenna elements 912 and 914 of WECs 804 and 806, respectively, are configured to use a second frequency $f_2$ to communicate with each other. Accordingly, communication between WEC 902 and WEC 908 and communication between WEC 904 and 906 can take place concurrently without causing interference to one another. Further, the capacity and reliability of wireless bus 900 is increased. In particular, in the example of FIG. 9, the capacity of wireless bus 000 is doubled by the example frequency diversity scheme as shown.

It is noted that frequency diversity according to embodiments is based on assigning communication frequencies on a link basis. Thus, the antenna element of a particular WEC may use different communication frequencies on different communication links. This includes using different communication frequencies to communicate with different WECs and/or using different communication frequencies to communicate with a single WEC (i.e., a first frequency to transmit, and a second frequency to receive).

Similar to the polarization diversity scheme discussed above, in embodiments, the frequency diversity scheme used within the wireless bus can be adapted dynamically according to one or more of data traffic patterns, desired capacity, interference levels, etc. As a result, links within the wireless bus are configured based on frequency in real-time.

B. Establishing a Wireless Link

FIG. 10 illustrates an example method 1000 for establishing a wireless communication bus among a plurality of WECs in accordance with an embodiment of the present invention. The WECs may be located on a single chip, in different chips on a single device, or in different devices. In method 1000, a first channel is used for target acquisition, and a second channel is used for data communication. In an embodiment, the first channel may have a lower bandwidth than the second channel. Additionally, the first channel may have a frequency of approximately 2.420 GHz to approximately 2.421 GHz, while the second channel may have a frequency of approximately 2.419 GHz to approximately 2.428 GHz, to provide some examples.

Specifically, referring to FIG. 10, method 1000 begins at a step 1002 in which proximally located WECs are identified via a control channel (e.g., a low-speed channel). A proximally located WEC is, for example, a WEC that is within range of another WEC such that the two WECs may wirelessly communicate with each other. In an embodiment, the control channel may be implemented using a wireless boundary scan. In another embodiment, the control channel may be implemented using the Standard Test Access Port and Boundary-Scan Architecture, commonly referred to as Joint Test Action Group (JTAG).

To identify the proximally located WECs as in step 1002 of FIG. 10, a search algorithm may be executed. The search algorithm causes a WEC to scan a surrounding area to identify proximally located WECs. The mechanism used to scan the surrounding area may be based on a substantially omni-directional transmission (such as, for example, a locating beacon), substantially unidirectional transmissions (such as, for example, an electrically steered phased array (FIG. 6A), a MEMS-based phased array (FIG. 6B), a mechanically steered directional antenna (FIG. 6C), an optical phased array (FIG. 7A), or a mechanically steered optical transceiver (FIG. 7B)), and/or a combination of omni-directional and unidirectional transmissions.

For example, FIG. 11A illustrates a WEC 1102 that transmits a signal 1120 to scan a surrounding area for proximally located WECs 1104, 1106, 1108, and 1110. In the example of FIG. 11A, WEC 1104 receives a portion 1120D of signal 1120; WEC 1106 receives a portion 1120A of signal 1120; WEC 1108 receives a portion 1120B of signal 1120; and WEC 1110 receives a portion 1120C of signal 1120. As alluded to above, portions 1120A-D of signal 1120 may be generated using unidirectional transmission mechanisms, using omni-directional transmission mechanisms, or a combination thereof. If a substantially unidirectional transmission mechanism is used, portions 1120A-D of signal 1120 are sequentially transmitted using a unidirectional transmission mechanism as disclosed herein. For example, portion 1120A may be transmitted first, then portion 1120B, then portion 1120C, and then portion 1120D. If, on the other hand, a substantially omni-directional transmission mechanism is used, then portions 1120A-D of signal 1120 are transmitted substantially simultaneously, such that portions 1120A-D propagate outward from WEC 1102 in an isotropic fashion.

In an embodiment, each WEC 1104, 1106, 1108, and 1110 includes an element (e.g., an antenna), enabling it to back-scatter transmit signal 1120. In another embodiment, signal 1120 is simply scattered off of WECs 1104, 1106, 1108, and 1110. In a further embodiment, signal 1120 may comprise a return transmission from WECs 1104, 1106, 1108, and 1110. In any such embodiment, the backscatter-transmitted, scattered, and/or return-transmission signals are subsequently received by WEC 1102, enabling the relative position (e.g., direction and/or distance) of WECs 1104, 1106, 1108, and 1110 (with respect to WEC 1102) to be determined. For example, the relative position may be determined using techniques of radar and/or sonar and/or another technique.

In an embodiment, WEC 1102 includes a module to determine the relative position of proximally located WECs. For example, core module 208 (of FIGS. 2A-B) may be configured to determine the relative positions of proximally located WECs. In another embodiment, WEC 1102 transmits the subsequently received signals to a controller (such as, a specially configured WEC), enabling the controller to determine the relative positions of the proximally located WECs and then transmit these relative positions back to WEC 1102.

Referring again to FIG. 10, after identifying the proximally located WECs, communications among the proximally located WECs is supported via a data channel (e.g., a high-speed channel), as illustrated in a step 1004. The transmission protocol used for communication among the proximally located WECs may be based on time division multiple access (TDMA), frequency division multiple access (FDMA), code division multiple access (CDMA), or a combination thereof. Communications over the data channel use the directional transmission techniques disclosed herein (such as, for example, an electrically steered phased array (FIG. 6A), a MEMS-based phased array (FIG. 6B), a mechanically steered directional antenna (FIG. 6C), an optical phased array (FIG. 7A), or a mechanically steered optical transceiver (FIG. 7B)). In an embodiment, the communication mechanism (e.g., beamforming, optical, etc.) is selected based on the relative position and capabilities of the proximally located WECs.

FIG. 11B illustrates communications via a data channel. In this example, WEC 1102 sends a communications signal 1130, via the data channel, to proximally located WEC 1106 and sends a communications signal 1132, via the data channel, to proximally located WEC 1104.

V. Configuring an Array of WEC

With the different types of links between WECs, a plurality of wirelessly coupled WECs can be configured as a field-programmable communications array ("FPCA") in accordance with an embodiment of the present invention. Individual WECs of the FPCA may be configured for specific functions, and communications among the WECs of the FPCA may also be configured. For example, one or more WECs may be configured as processing resources of the FPCA, one or more WECs may be configured as memory resources of the FPCA, and/or one or more WECs may be configured as repeaters.

FIG. 12 illustrates an example FPCA 1200 in accordance with an embodiment of the present invention. Referring to FIG. 12, FPCA 1200 includes a controller 1202 and a plurality of WECs 1204, 1206, 1208, and 1210. In an embodiment, controller 1202 is a WEC. Controller 1202 is respectively coupled to WECs 1204, 1206, 1208, and 1210 via control links 1220A, 1220B, 1220C, and 1220D. Control links 1220A-D collectively comprise a control channel 1220, enabling controller 1202 to configure the functionality of FPCA 1200. In this regard, controller 1202 is adapted to configure the functional resource (e.g., core module) of each WECs 1204, 1206, 1208, and 1210 of FPCA 1200 and to configure communications among WEC 1204, 1206, 1208, and 1210. In an embodiment, controller 1202 configures the core module and/or wireless transceiver of each WEC 1204, 1206, 1208, and 1210 by modulating the power provided to each WEC, as described above, for example, in Section III.

As an example of the configuration of the core module, controller 1202 may configure WEC 1210 as a memory resource of FPCA 1200 and may configure WEC 1208 as a processing resource of FPCA 1200. In accordance with this example, WEC 1208 may write data to and read data from WEC 1210 via a communications link 1232.

As an example of the configuration of communications among the WECs, controller 1202 may configure WEC 1204 as a repeater. In accordance with this example, WEC 1208 and WEC 1206 may communicate via WEC 1204. That is, in accordance with this example, transmissions from WEC 1208 to WEC 1206 are first sent from WEC 1208 to WEC 1204 over a communications link 1234 and then sent from WEC 1204 to WEC 1206 over a communications link 1236. In a similar manner, transmission from WEC 1206 to WEC 1208 are first sent from WEC 1206 to WEC 1204 over communications link 1236 and then sent from WEC 1204 to WEC 1208 over communications link 1234.

It is to be appreciated, however, that the examples presented above are for illustrative purposes only, and not limitation. A plurality of wirelessly coupled WECs may be configured into other types of FPCA and/or other types of systems without deviating from the spirit and scope of embodiments of the present invention. Example applications of such FPCAs and/or systems are presented below.

VI. Example Applications

Wirelessly coupled WECs may be configured for many different types of applications. Presented below are the following example applications:

(A) a system with link and route adaptivity;
(B) a system that includes scalable links among the WECs;
(C) a system that includes co-located resources;
(D) a system in which resources are dynamically borrowed;
(E) a data center/server system; and
(F) a system created on the fly.

It is to be appreciated, however, that these example applications are presented for illustrative purposes only, and not limitation. Adaptations and modifications of these example applications, as would be apparent to persons skilled in the relevant art(s) based on teachings contained herein, are contemplated within the spirit and scope of embodiments of the present invention.

A. Link and Route Adaptivity

FIG. 13 illustrates an example wireless bus 1300 enabled by a plurality of WECs 1302, 1304, 1306, and 1308 according to an embodiment of the present invention.

According to embodiments, links and/or routes among WECs 1302, 1304, 1306, and 1308 may be adapted based on various factors. For example, the links between WEC 1302 and 1306 may be adapted according to one or more of, among other factors, the relative position of WECs 1302 and 1306, available capabilities (e.g., communication capabilities) at WECs 1302 and 1306, availability of resources at WECs 1302 and 1306, and the physical environment.

For example, the relative position of WECs 1302 and 1306 may be a factor in determining the type of links between WECs 1302 and 1306 (e.g., RF, optical, proximity coupling). Thus, in embodiments, if the relative position of WECs 1302 and 1306 changes, the links between WECs 1302 and 1306 may be adapted accordingly to ensure reliable communication. For example, the links between WECs 1302 and 1306 may be adapted from optical to RF if changes in the relative position of WECs 1302 and 1306 cause a loss of line-of-sight between WECs 1302 and 1306. Similarly, the physical environment may cause the links between WECs 1302 and 1306 to be adapted from one type to another.

Similarly, available capabilities (e.g., communication capabilities) at WECs 1302 and 1306 govern the type of links that can be created between WECs 1302 and 1306, as well as the range of adaptability of the links. For example, the type of antenna elements as well as the configurability of the antenna elements (e.g., directionality, polarization, frequency) available at WECs 1302 and 1306 may determine whether and/or how WECs 1302 and 1306 may communicate. For example, WEC 1302 may include a mechanically steered RF directional antenna such as antenna 614 shown in FIG. 6C, and a one-directional optical transceiver, as a result of which only RF communication can be supported between WEC 1302 and WEC 1306. However, in another example, WEC 1302 may include a mechanically steered optical transceiver such as optical transceiver 710 shown in FIG. 7B, as a result of which both RF and optical communication may be supported between WEC 1302 and WEC 1306, and the links between WEC 1302 and 1306 may be adapted as either RF or optical, or both.

The availability of resources at WECs 1302 and 1306 may also be used in adapting the links between WECs 1302 and 1306. For example, assuming that WECs 1302 and 1306 may communicate either using RF or optical communication and that WEC 1306 communicates using RF with WEC 1304, then the links between WEC 1302 and 1306 may be adapted for optical communication because the RF transceiver at WEC 1306 may not be available or capable of supporting concurrent RF communication with both WECs 1302 and 1304.

In addition to the ability to adapt links between WECs, communication routes among WECs may be adapted according to embodiments of the present invention. For example, referring to FIG. 13, communication routes between WECs 1302 and 1304 may be adapted according to one or more of the relative position of WECs 1302 and 1304, available capabilities (e.g., communication capabilities) at WECs 1302 and 1304 as well as at WECs along the routes, availability of resources at WECs 1302 and 1304 and at WECs along the routes, and the physical environment.

The relative position of WECs 1302 and 1304 and the physical environment may determine route selection between WECs 1302 and 1304, including, for example, the availability of direct (i.e., single hop) communication versus multi-hop communication. For example, referring to FIG. 13, the presence of a communication barrier (e.g., physical barrier) between WEC 1302 and WEC 1304 may prohibit direct communication between the two WECs and require a multi-hop communication route to be used (via either WEC 1306 or WEC 1308). However, if the relative position of WECs 1302 and 1304 and/or the physical environment change, the communication routes between WEC 1302 and 1304 may be adapted accordingly to ensure optimal communication. For example, the route between WECs 1302 and 1304 may be adapted from multi-hop to single hop if the physical barrier is no longer present.

Similarly, available capabilities (e.g., communication capabilities) and/or resources (e.g., energy, processing power, etc.) at WECs 1302 and 1304 as well as at WECs 1306 and 1308 may be a factor in route selection. For example, antenna elements at WEC 1302 may not support the communication range required to communicate directly with WEC 1304. Thus, WEC 1302 may opt to communicate via WEC 1306 or WEC 1308 if either is within communication range. In another example, processing loads at WECs 1306 and 1308 determine which WEC is used to establish a multi-hop route from WEC 1302 to WEC 1304.

As would be understood by a person skilled in the art based on the teachings herein, embodiments of the present invention are not limited to the examples described above. For example, a person of skill in the art would appreciate that other factors may be used to adapt links and/or routes among WECs. While these other factors are not explicitly mentioned above, they are apparent to a person of skill in the art based on the teachings herein and are within the scope of embodiments of the present invention.

B. Scalable Wireless Bus

WECs may be used in accordance with the features described herein to enable a scalable wireless bus. In an embodiment, the scalable wireless bus may have at least one of the number of links among WECs and the capacity of said links adapted based on one or more factors. For example, the number of links and the capacity of the links may be adapted according to one or more of, among other factors, expected activity level over the wireless bus, desired power consumption, delay, and interference levels. Examples illustrating a scalable wireless bus according to an embodiment are provided in FIGS. 14-17. These examples are provided for the purpose of illustration only and are not limiting of the scope of embodiments of the present invention. Further, any variations and/or improvements that would be apparent to a person of skill in the art based on the teachings herein are also within the scope of embodiments of the present invention.

FIG. 14 illustrates an example wireless bus 1400 enabled by a plurality of WECs 1402, 1404, 1406, and 1408 and a plurality of wireless links connecting the WECs. In an embodiment, wireless bus 1400 is adaptable according to expected activity level over the wireless bus. In particular, wireless bus 1400 can be adapted to increase/decrease the number of links that connect WECs 1402, 1404, 1406, and 1408 according to expected activity level. For example, as shown in FIG. 14, at low activity level, only three links 1410, 1412, and 1414 may be established to enable communication over wireless bus 1400. At high activity level, however, two additional links 1416 and 1418 are established to accommodate the increased activity. Additionally or alternatively, wireless bus 1400 can be adapted to increase/decrease the capacity of each link according to expected activity level. Link capacity can be increased/decreased by varying one or more of, among other factors, transmit power, modulation scheme, and error coding.

FIG. 15 illustrates another example wireless bus 1500. In an embodiment, wireless bus 1500 is adaptable to increase/decrease the number of links among WECs 1402, 1404, 1406, and 1048 according to expected activity level over the wireless bus. In particular, the number of links between any two WECs is increased at high activity level using polarization diversity. For example, as shown in FIG. 15, for each existing link 1410, 1412, and 1414 at low activity level, a respective link 1502, 1504, and 1506 is established at high activity level, such that the existing link and the added link use orthogonal polarizations. Additionally or alternatively, wireless bus 1500 can be adapted to increase/decrease the capacity of each link according to expected activity level. Link capacity can be increased/decreased by varying one or more of, among other factors, transmit power, modulation scheme, and error coding.

FIG. 16 illustrates an example wireless bus 1600 enabled by a plurality of WECs 1602, 1604, 1606 and 1608. In an embodiment, wireless bus 1600 is adaptable according to desired power consumption and/or delay. For example, as shown in FIG. 16, when lower power consumption is desired and/or higher delay can be accommodated, wireless bus 1600 may be adapted to have more shorter range communication links, such as links 1610, 1612, and 1614, and multi-hop routes. In contrast, when lower delay is desired and/or when higher power consumption can be accommodated, wireless bus 1600 can be adapted to utilize more longer range communication links, such as communication link 1616, and single hop routes.

FIG. 17 illustrates an example wireless bus 1700 enabled by a plurality of WECs 1702, 1704, 1706, and 1708. In an embodiment, wireless bus 1700 is adaptable according to expected/desired interference levels. For example, as shown in FIG. 17, when higher interference is acceptable and/or when expected interference is low (based on expected traffic), wireless bus 1700 can be adapted to include wireless links 1710, 1712, 1714, and 1716. Further, links 1714 and 1716 may be of same polarization (or frequency), for example. On the other hand, when lower interference is desired and/or when expected interference is high (based on expected traffic), wireless bus 1700 can be adapted to include links 1710, 1712, and 1714 only, in order to reduce interference. In particular, in the example of FIG. 17, interference due to links 1714 and 1716 is reduced. Alternatively, wireless bus 1700 may include link 1716, adapted however to use a different polarization (or frequency) than link 174. Thus, no interference due to links 1714 and 1716 may occur.

C. Co-location of Resources

In an embodiment, wirelessly enabled functional units of a first type (e.g., processing resources) are spatially separated from wirelessly enabled functional units of a second type (e.g., memory resources), but wirelessly coupled to each other via a wireless communications bus.

For example, FIG. 18 illustrates a system that includes a plurality of processing resources 1800 and a plurality of memory resources 1850. Processing resources 1800 and memory resources 1850 are spatially separated, but wirelessly coupled via a wireless communications bus 1860. Processing resources 1800 may be included in one or more stacks, in one or more devices, on one or more printed circuit boards, or in another form factor that enables processing resources 1800 to be co-located. Similarly, memory resources 1850 may be included in one or more stacks, in one or more devices, on one or more printed circuit boards, or in another form factor that enables memory resources 1850 to be co-located.

Referring to FIG. 18, processing resources 1800 include a plurality of WECs 1802A-1802N, wherein each WEC 1802A-1802N respectively includes a corresponding processing module 1804A-1804N. Similarly, memory resources 1850 include a plurality of WECs 1852A-1852N, wherein each WEC 1852A-1852N respectively includes a corresponding memory module 1854A-1854N.

In the system of FIG. 18, memory is dynamically allocated to a processing module 1804 by dynamically associated one or more memory modules 1854 with the processing module 1804 via wireless communications bus 1860. To dynamically allocate the memory modules 1854 to respective processing modules 1804, the system may include a controller, such as, for example, controller 1202 of FIG. 12.

D. Resource Borrowing

WECs may be used in accordance with the features described herein to enable a wireless resource borrowing environment. In particular, a wireless bus to connect a plurality of WECs is first established as described above, and then the wireless bus is used to enable the plurality of WECs to share and/or borrow resources among each others.

For example, FIG. 19 illustrates an example wireless bus 1900 adapted to enable resource borrowing among a plurality of WECs 1902, 1904, and 1906 according to an embodiment of the present invention. In an embodiment, example wireless bus 1900 is established on the fly, as further described below in Section VI.F. Wireless bus 1900 is established, for example, by establishing wireless links 1912 and 1914. Other wireless links among WECs 1902, 1904, and 1906 may also be established.

In an embodiment, WECs use the established wireless bus to share resource information (including resource availability information) among each others. For example, a WEC may share with other WECs information regarding its processing resources (e.g., DSP, FPGA, ASIC, analog, etc.) and memory resources (e.g., read-only, RAM, NVRAM, etc.). The WEC may then use the shared resource information to identify resources at other WECs that it may borrow to perform certain tasks. Alternatively or additionally, WECs may use a server, as further described below in Section VI.F, to download resource information.

For example, referring to FIG. 19, to aid it in performing a particular task, WEC 1902 may identify as available for borrowing a processing module 1908 at WEC 1904 and a memory module 1910 at WEC 1906. WEC 1902 may then use wireless links 1912 and 1914 to borrow processing module 1908 and memory module 1910, respectively.

In an embodiment, WEC 1902 sends borrowing requests to WECs 1904 and 1906 to borrow processing module 1908 and memory module 1910, respectively. In response, WEC 1902 receives borrowing permissions from WECs 1904 and 1906, respectively, if processing module 1908 and memory module 1910 are available. In an embodiment, a borrowing permission includes an allotted usage time for using the resource. WEC 1902 can then use processing module 1908 and memory module 1910 via links 1912 and 1914, respectively, as if the two modules actually belonged thereto.

WEC 1902 may use processing module 1908 and memory module 1910 according to the allotted usage times specified in their respective borrowing permissions. When WEC 1902 is done using a resource and/or when the allotted usage time for the resource expires, WEC 1902 releases the resource back to its owner WEC.

In an embodiment, resource borrowing in a wireless WEC environment is performed according to a cost-based method which optimizes resource borrowing according to a cost function. The cost function may be designed to optimize resource borrowing according to any combination of one or more factors, including power consumption, processing speed, delay, interference, error rate, reliability, load at the lender WEC, computing capability at the lender WEC, etc.

FIG. 20 is a process flowchart 2000 of an example cost function-based resource borrowing method according to an embodiment of the present invention. In an embodiment, process 2000 is performed at a WEC in order to borrow a desired resource from neighboring WECs in a wireless WEC environment. In another embodiment, process 2000 is performed at a controller based on a request from the WEC.

Process 2000 begins in step 2002, which includes determining a desired resource. In an embodiment, the desired resource is a resource needed to perform a particular task at the WEC. The desired resource may be a processing resource or a memory resource, for example. In an embodiment, determining a desired resource includes determining a type of the desired resource, properties of the desired resource (e.g., size, speed, etc.), and a required usage time of the resource (e.g., when, for how long, etc.).

Step 2004 includes identifying one or more neighboring WECs of the WEC that have the desired resource. In an embodiment, neighboring WECs include WECs which are a single hop away from the WEC (i.e., WECs with which direct communication can be performed reliably). In another embodiment, neighboring WECs include all WECs that are within communication reach of the WEC (regardless of the number of hops needed for communication). In an embodiment, step 2004 includes processing resource information obtained from neighboring WECs and/or from a server to determine neighboring WECs having the desired resource available for the required usage time.

Step 2006 includes calculating, for each of the identified one or more neighboring WECs, a cost function associated with borrowing the desired resource from the neighboring WEC. In an embodiment, the cost function is a function of any combination of one or more factors, including power consumption, processing speed, delay, interference, error rate, reliability, load at the lender WEC, computing capability at the lender WEC, etc.

Finally, step 2008 includes selecting a WEC from among the identified neighboring WECs having the minimum cost function from among the calculated cost functions in step 2006; and borrowing the desired resource from the selected WEC.

As noted above, process flowchart 2000 illustrates an example cost-based resource borrowing method according to embodiments of the present invention. This example is provided for the purpose of illustration only and is not limiting of the scope of embodiments of the present invention. Further, any variations and/or improvements that would be apparent to a person of skill in the art based on the teachings herein are also within the scope of embodiments of the present invention. For example, process 2000 may be modified to enable cost-based resource borrowing of a plurality of resources from one or more neighboring WECs. As such, the cost function optimizes resource borrowing with respect to borrowing more than one resource at the same time from one or more WECs.

E. Wire-free Data Center/Server

WECs may be used in accordance with the features described herein to enable various applications in the data center/server context. In particular, a wire-free data center/server is described below. The data center/server is wire-free in the sense that communication within a data unit of the data center/server (i.e., intra-data unit), between data units of the data center/server (inter-data unit), and between the data units and the backplane of the data center/server is performed wirelessly.

FIG. 21 illustrates an example wireless bus 2100 enabled by a plurality of WECs 2108-2124 located in respective data units 2102, 2104, and 2106 of a data center/server according to an embodiment of the present invention. Communication between the various WECs 2108-2124 is performed wirelessly and in accordance with the various wireless communication types and methods described above. In an embodiment, each data unit includes one or more WECs with the ability to wirelessly communicate with WECs located on other data units. As such, wireless communication between the various data units is enabled. For example, as shown in FIG. 21, WECs 2108, 2112, 2116, 2118, and 2120 establish wireless links 2126, 2128, and 2130, which enable communication between any two of data units 2102, 2104, and 2106.

Low communication delay between data units in a data center/server is desired. Accordingly, in an embodiment, multiple links and/or routes are established among the data units to decrease delay and reduce the possibility of bottlenecks in the wireless bus. For example, as shown in FIG. 22, example wireless bus 2200 includes two routes between data units 2102 and 2106 so that communication traffic can be split onto separate routes (2126, 2130; and 2202, 2204) via WECs 2114 and 2116 of data unit 2104. In an embodiment, as discussed above, example wireless bus 2200 can be adapted according to expected traffic, for example, to establish one or both of the routes.

Similarly, low interference is desired in a data center/server. Accordingly, in an embodiment, spatial diversity is be used to spatially separate as much as possible wireless links established between data units. For example, as shown in FIG. 23, example wireless bus 2300 includes two wireless links 2202 and 2302 that are established with a maximum possible spatial separation in order to reduce interference.

In another embodiment, frequency and/or polarization diversity are used to minimize interference and/or increase communication capacity of the wireless bus. For example, as shown in FIG. 24, example wireless bus 2400 includes two wireless routes (2126, 2130; and 2202, 2204) that enable communication among data units 2102, 2104, and 2106. Further, the routes are established such that links 2126 and 2202 are RF links with frequency diversity, and links 2130 and 2204 are optical links with polarization diversity. As such, communication over both routes can occur concurrently with minimal or no interference. Further, no interference occurs at intermediate WECs 2114 and 2116.

In addition to intra-data unit and inter-data unit wireless communication, in an embodiment, communication between data units and the backplane of the data center/server is performed wirelessly. For example, as shown in FIG. 25, example wireless bus 2500 additionally includes wireless links 2510 and 2512 established respectively between WEC 2110 of data unit 2102 and WEC 2504 of the backplane 2502 and between WEC 2124 of data unit 2106 and WEC 2508 of the backplane 2502. In an embodiment, each data unit includes at least one WEC capable of wirelessly communicating directly with the backplane.

F. Creation of a System on the Fly

In an embodiment, WECs are dynamically coupled into a system on the fly. The system may include one or more WECs that function as processing resources and one or more other WECs that function as memory resources, in a similar manner to that described above with respect to FIG. 18. In addition, WECs may be dynamically added to the system (as they come into communications range of the system), and WECs may be dynamically dropped from the system (as they move out of communications range of the system). A WEC may be configured to store information about past links with other WECs, especially if a problem occurred with a previous link. To support the fluidity of such a system, WECs are configured to scan their respective environments for a server (which may be a WEC), upload their respective resource availabilities to the server, and then download appropriate linking capabilities from the server.

For example, FIG. 26 illustrates an example method 2600 for creating a system on the fly in accordance with an embodiment of the present invention. Referring to FIG. 26, method 2600 begins at a step 2602 in which a WEC searches for WECs and/or a server. In an embodiment, the WEC searches for all proximally located WECs. In another embodiment, the WEC searches for only WECs that are part of a single ecosystem (e.g., WECs from a single provider).

The server of method 2600 may be a WEC, and the WEC designated as the server may change over time. For example, a first WEC may be designated as a server of the system on the fly during a first period of time, and a second WEC may be designated as a server of the system on the fly during a second period of time. Additionally or alternatively, there may be more than one server for the system. For example, a first server could accommodate all WECs included in a first device or all WECs included in a first region of space, and a second server could accommodate all WECs included in a second device or all WECs included in a second region of space.

The search of step 2602 may be performed (substantially) continually, at predefined time intervals, at the occurrence of a qualifying event (e.g., start up), and/or at another time. This search may be based on any of the search techniques disclosed herein—including, but not limited to, a search based on an electrically steered phased array (FIG. 6A), a MEMS-based phased array (FIG. 6B), a mechanically steered directional antenna (FIG. 6C), an optical phased array (FIG. 7A), a mechanically steered optical transceiver (FIG. 7B), or a locating beacon. (See, e.g., Section IV, supra.)

In step 2604, the WEC uploads its resource capabilities to the server. For example, the WEC may upload the amount of memory and/or the amount of processing power it has available. The WEC may also upload additional information—such as, for example, its location or relative position, what resources it is looking to couple with, a type of communication protocol, a security code, or other information that may be used to couple the WEC with another WEC.

In step 2608, the WEC downloads a linking resource (e.g., control logic) from the server. The linking resource enables the WEC to link to other WECs of the system on the fly. For example, the linking resource may: (i) identify WECs included in the system on the fly; (ii) identify WECs to link to; (iii) define the type of link between the WEC and other WECs (see, e.g., Section IV.A, supra); (iv) configure the functional resource of the WEC and/or the type of wireless communication between the WEC and other WECs (see, e.g., Section V, infra.); (v) update program code and/or an operating system of the WEC; and/or (vi) provide other information and/or functionality to enable a WEC to link to other WEC included in the system on the fly. After downloading the linking resource, the WEC is configured to link to one or more other WECs in accordance with the linking resource.

VII. Conclusion

Various aspects of embodiments of the present invention can be implemented using software, firmware, hardware, or a combination thereof. For example, the representative signal-processing functions described herein (e.g. transmission of wireless signals, reception of wireless signals, processing of wireless signals, etc.) can be implemented in hardware, software, or a combination thereof. For instance, the signal-processing functions can be implemented using general-purpose processors (e.g., CPUs), logic (e.g., computer logic), application-specific integrated circuits (ASIC), digital signal processors, etc., as will be understood by those skilled in the arts based on the discussion given herein. Accordingly, any processor that performs the signal-processing functions described herein is within the scope and spirit of the present invention.

Further, the signal-processing functions described herein could be embodied by program instructions that are executed by a processor or any one of the hardware devices listed above. The program instructions cause the processor to perform the signal-processing functions described herein. The program instructions (e.g. software) can be stored in a computer-readable storage medium, computer-program medium, or any storage medium that can be accessed by a computer or processor. Such media include a memory device such as a RAM or ROM, or other type of data storage medium such as a computer disk or CD ROM, or the equivalent. Accordingly, any data storage medium having program code that cause a processor to perform the signal-processing functions described herein are within the scope and spirit of the present invention.

Embodiments of the present invention can work with software, hardware, and/or operating system implementations other than those described herein. Any software, hardware, and operating system implementations suitable for performing the functions described herein can be used.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method implemented in a wireless-enabled component (WEC), comprising:
   transmitting, via a first channel, a signal to one or more other WECs;
   receiving, via the first channel, a response from the one or more other WECs, wherein the one or more other WECs and the WEC are located within one or more chips within a device;
   determining a relative position and capabilities of the one or more other WECs based on the received response, wherein the relative position includes a direction of the one or more other WECs relative to the WEC and a distance between the one or more other WECs and the WEC;
   selecting a communication mechanism for communicating over a second channel based on the relative position and capabilities of the one or more other WECs; and
   communicating, via the second channel, with the one or more other WECs in accordance with the selected communication mechanism.

2. The method of claim 1, wherein the first channel has a lower bandwidth than the second channel.

3. The method of claim 1, wherein the first channel has a frequency of approximately 2.420 GHz to approximately 2.421 GHz and the second channel has a frequency of approximately 2.419 GHz to approximately 2.428 GHz.

4. The method of claim 1, wherein the transmitted signal includes a locating beacon.

5. The method of claim 1, wherein the received response includes a locating beacon from each of the one or more other WECs.

6. A wireless-enabled component (WEC), comprising:
   a functional resource; and
   a communications module that is configured to:
      transmit, via a first channel, a signal to one or more other WECs;
      receive, via the first channel, a response from the one or more other WECs, wherein the one or more other WECs and the WEC are located within one or more chips within a device;
      determine a relative position and capabilities of the one or more other WECs based on the received response, wherein the relative position includes a direction of the one or more other WECs relative to the WEC and a distance between the one or more other WECs and the WEC;
      select a communication mechanism for communicating over a second channel based on the relative position and capabilities of the one or more other WECs; and
      communicate, via the second channel, with the one or more other WECs in accordance with the selected communication mechanism.

7. The WEC of claim 6, wherein the functional resource comprises one of a processing resource and a memory resource.

8. The WEC of claim 6, wherein the first channel has a lower bandwidth than the second channel.

9. The WEC of claim 8, wherein the first channel has a frequency of approximately 2.420 GHz to approximately 2.421 GHz and the second channel has a frequency of approximately 2.419 GHz to approximately 2.428 GHz.

10. The WEC of claim 6, wherein the transmitted signal includes a locating beacon.

11. The WEC of claim 6, wherein the received response includes a locating beacon from each of the one or more other WECs.

12. The WEC of claim 6, further comprising:
a locating module configured to determine the relative position of each of the one or more other WECs.

13. A system, comprising:
a plurality of wireless-enabled components (WECs), each configured to transmit and receive over a wireless bus, wherein the wireless bus includes a first channel and a second channel,
wherein a first WEC from the plurality of WECs is configured to:
  transmit, via the first channel, a signal to at least one other WEC from the plurality of WECs;
  receive, via the first channel, a response from the other WEC, wherein the other WEC and the first WEC are located within one or more chips within a device;
  determine a relative position and capabilities of the other WEC based on the received response, wherein the relative position includes a direction of the other WEC relative to the first WEC and a distance between the other WEC and the first WEC;
  select a communication mechanism for communicating over the second channel based on the relative position and capabilities of the other WEC; and
  communicate, via the second channel, with the other WEC in accordance with the selected communication mechanism.

14. The system of claim 13, wherein the first channel has a lower bandwidth than the second channel.

15. The system of claim 14, wherein the first channel has a frequency of approximately 2.420 GHz to approximately 2.421 GHz and the second channel has a frequency of approximately 2.419 GHz to approximately 2.428 GHz.

16. The system of claim 13, wherein the transmitted signal includes a locating beacon.

17. The system of claim 13, wherein each of the plurality of WECs comprises a functional resource.

18. The system of claim 13, wherein each of the plurality of WECs comprises:
a locating module configured to determine the relative position of each of the plurality of WECs.

19. The system of claim 13, wherein the plurality of WECs is located on a single chip.

20. The system of claim 13, wherein:
a first subset of the plurality of WECs is located on a first chip; and
a second subset of the plurality of WECs is located on a second chip.

21. The system of claim 20, wherein the first chip and the second chip are located in a single device.

22. The system of claim 20, wherein the first chip and the second chip are located in separate devices.

23. The system of claim 13, wherein the received response includes at least one of a backscatter-transmitted signal, a scattered signal, and a return-transmission signal.

24. The system of claim 13, wherein the relative position of the other WEC is determined using at least one of a radar technique and a sonar technique.

25. The system of claim 13, wherein the relative position of the other WEC is determined by a controller located at a position removed from the first WEC.

26. The system of claim 13, wherein the selected communication mechanism includes communicating using at least one of an electrically steered phased array, a MEMS-based phased array, a mechanically steered directional antenna, an optical phased array, and a mechanically steered optical transceiver.

27. The system of claim 13, wherein the capabilities of the at least one other WEC is indicative of at least one of communication capabilities, processing capabilities, linking capabilities, computing capabilities and resource capabilities of the one or more other WECs.

* * * * *